United States Patent
Wang et al.

(10) Patent No.: US 10,510,839 B2
(45) Date of Patent: Dec. 17, 2019

(54) SEMICONDUCTOR DEVICE AND METHOD FOR MANUFACTURING THE SAME

(71) Applicant: TAIWAN SEMICONDUCTOR MANUFACTURING COMPANY LTD., Hsinchu (TW)

(72) Inventors: I-Hsiu Wang, Tainan County (TW); Yean-Zhaw Chen, Tainan (TW); Ying-Ting Hsia, Kaohsiung (TW); Jhao-Ping Jiang, Changhua County (TW); Chun-Chih Cheng, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/043,513

(22) Filed: Jul. 24, 2018

(65) Prior Publication Data
US 2019/0165101 A1    May 30, 2019

Related U.S. Application Data

(60) Provisional application No. 62/592,056, filed on Nov. 29, 2017.

(51) Int. Cl.
| *H01L 21/308* | (2006.01) |
| *H01L 29/08* | (2006.01) |
| *H01L 21/8238* | (2006.01) |
| *H01L 21/768* | (2006.01) |
| *H01L 23/532* | (2006.01) |
| *H01L 29/66* | (2006.01) |

(52) U.S. Cl.
CPC ...... *H01L 29/0847* (2013.01); *H01L 21/3085* (2013.01); *H01L 21/76829* (2013.01); *H01L 21/823814* (2013.01); *H01L 21/823821* (2013.01); *H01L 23/5329* (2013.01); *H01L 29/6656* (2013.01)

(58) Field of Classification Search
CPC ............ H01L 29/0847; H01L 29/6656; H01L 21/3085; H01L 21/76829; H01L 21/823814; H01L 21/823821; H01L 23/5329
See application file for complete search history.

(56) References Cited

U.S. PATENT DOCUMENTS

2004/0224517 A1* 11/2004 Sugiyama ......... H01L 21/26586
                                                                  438/689
2008/0315305 A1* 12/2008 Matsudai ............ H01L 29/0847
                                                                  257/336

(Continued)

*Primary Examiner* — Sitaramarao S Yechuri
(74) *Attorney, Agent, or Firm* — WPAT, P.C., Intellectual Property Attorneys; Anthony King

(57) ABSTRACT

A method for manufacturing a semiconductor device includes following operations. A semiconductor substrate is received. A first semiconductive layer over the semiconductor substrate is formed. A plurality of dopants are formed in a first portion of the first semiconductive layer. A second portion of the first semiconductive layer is removed to form a patterned first semiconductive layer. A first sidewall profile of the first portion after the removing the second portion of the first semiconductive layer is controlled by adjusting a distribution of the plurality of dopants in the first portion.

20 Claims, 31 Drawing Sheets

(56) References Cited

U.S. PATENT DOCUMENTS

| | | | |
|---|---|---|---|
| 2009/0057771 A1* | 3/2009 | Fukasaku | H01L 21/28097 257/369 |
| 2009/0108347 A1* | 4/2009 | Adkisson | H01L 29/42368 257/339 |
| 2009/0294860 A1* | 12/2009 | Mowry | H01L 21/823807 257/368 |
| 2011/0284935 A1* | 11/2011 | Yamada | H01L 21/76897 257/288 |
| 2012/0088359 A1* | 4/2012 | Kim | H01L 21/28114 438/589 |
| 2013/0146975 A1* | 6/2013 | Cheng | H01L 29/66545 257/347 |
| 2016/0300721 A1* | 10/2016 | He | H01L 29/66795 |
| 2016/0379930 A1* | 12/2016 | Jain | H01L 23/5256 257/529 |
| 2018/0047754 A1* | 2/2018 | Basker | H01L 21/823431 |

* cited by examiner

SEMICONDUCTOR DEVICE AND METHOD FOR MANUFACTURING THE SAME

CROSS-REFERENCE TO RELATED APPLICATION

This application claims the benefit of U.S. Provisional Application No. 62/592,056 filed on Nov. 29, 2017, which is incorporated by reference in its entirety.

BACKGROUND

The size and distance between device structures is decreasing as the device concentration on integrated circuits continues to increase. However, the vertical heights of the gaps or trenches during manufacturing in the device normally do not decrease as fast as their horizontal widths. As a result, the gap or trench structures have larger ratios of height to width (i.e., higher aspect ratios).

While the ability to make device structures with increasing aspect ratios allows more of the structures (e.g., transistors, capacitors, diodes, etc.) to be packed onto the same surface area of a substrate, it has also created fabrication problems. One of these problems is the difficulty of filling deep narrow gaps or trenches without creating a void or seam in the material that fills the gaps or trenches. As the gaps or trenches during manufacturing decrease in size, and depositing material into the gaps or trenches becomes increasingly difficult, and increasingly likely to form a void.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
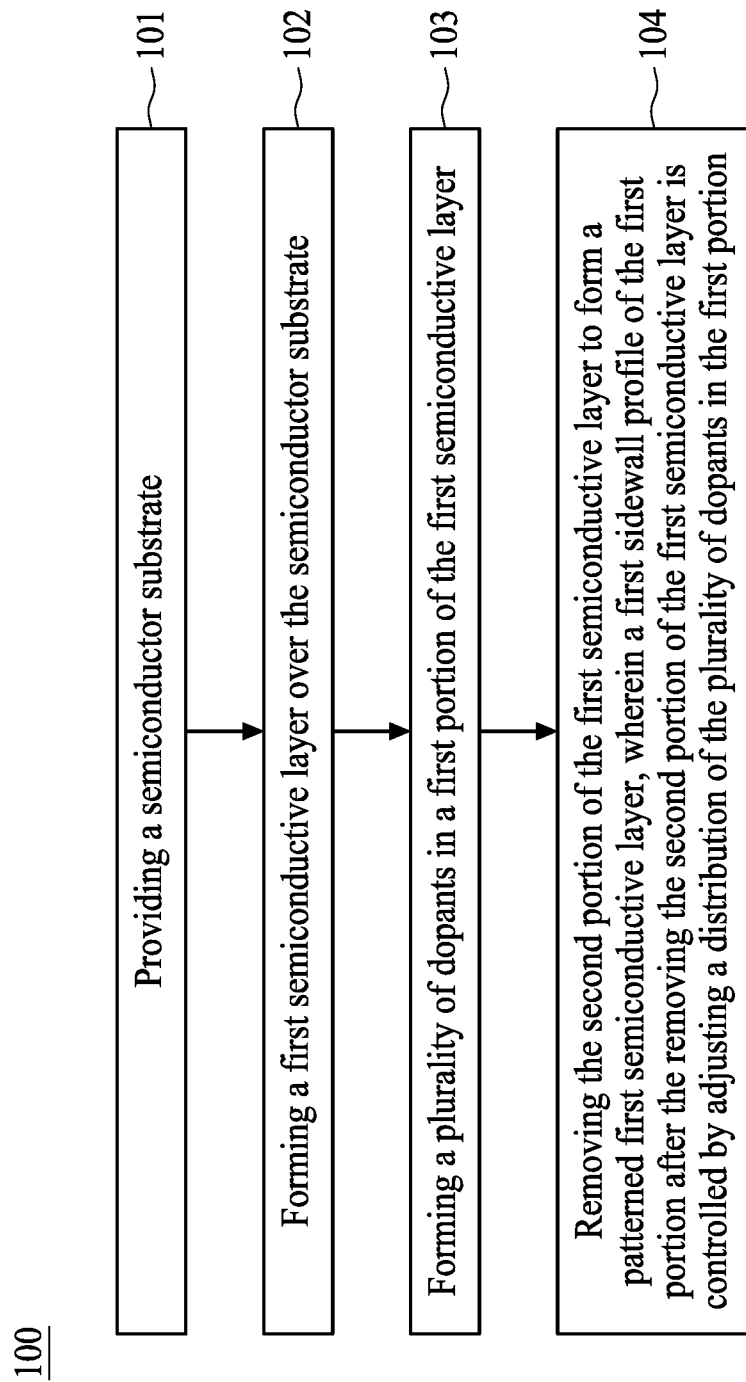
FIG. 1 is a flowchart illustrating a method for manufacturing a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In one or more embodiments of present disclosure, a plurality of dopants may be formed in a semiconductive layer used as a mask layer or a dummy gate structure. In some embodiments, the sidewall profile of the dummy gate structure may be adjustable with a doped bottom portion. In some embodiments, after removing the dummy gate structure, the aspect ratio and critical dimension of the gap profile may be improved, and thus the gap fill ability for the gate structure may be improved. In one or more embodiments of present disclosure, while the doped semiconductive layer used as a mask layer, the profile of a gate trench or an opening formed by the doped semiconductive layer may be adjustable accordingly. In some embodiments, the opening profile may be enlarged and the bridge issue of the via hole in the subsequent operations may be alleviated.

FIG. 1 is a flowchart illustrating a method for manufacturing a semiconductor structure, in accordance with some embodiments of the present disclosure. Referring to FIG. 1, in some embodiments, the method 100 includes operations 101-104. In operation 101, a semiconductor substrate is received. In operation 102, a first semiconductive layer over the semiconductor substrate is formed. In operation 103, a plurality of dopants are formed in a first portion of the first semiconductive layer. In operation 104, a second portion of the first semiconductive layer is removed to form a patterned first semiconductive layer. A first sidewall profile of the first portion after the removing the second portion of the first semiconductive layer is controlled by adjusting a distribution of the plurality of dopants in the first portion.

Figure 2:
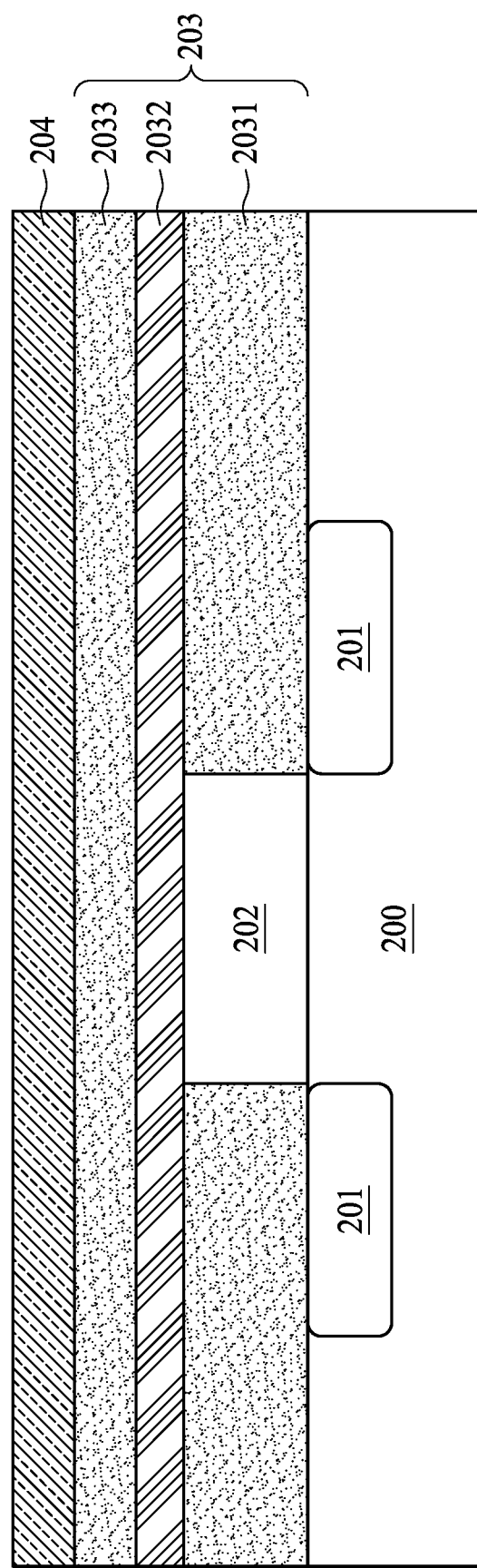
FIG. 2, FIG. 3, FIG. 4, FIG. 5, FIG. 6, FIG. 7, FIG. 8 and FIG. 9 are cross-sectional views of a semiconductor device fabricated at some stages, in accordance with some embodiments of the present disclosure.

FIG. 2, FIG. 3, FIG. 4, FIG. 5, FIG. 6, FIG. 7, FIG. 8, and FIG. 9 are cross-sectional views of a semiconductor device fabricated at some stages, in accordance with some embodiments of the present disclosure. Referring to FIG. 2 and operation 101 in FIG. 1, a semiconductor substrate 200 is received. In some embodiment, the semiconductor substrate 200 may be a silicon substrate. In other embodiments, the semiconductor substrate 200 may include other semiconductor materials, such as silicon germanium, silicon carbide, gallium arsenide, or the like. In other embodiments, the semiconductor substrate 200 is a p-type semiconductor substrate (P-Substrate) or an n-type semiconductor substrate (N-Substrate).

In some embodiments, a transistor structure is formed on the semiconductor substrate 200. In some embodiments, the transistor structure includes source/drain regions 201, and a gate 202. In some embodiments, the gate 202 is positioned over a top surface of the semiconductor substrate 200 and between the source/drain regions 201.

In some embodiments, an inter-layer dielectric (ILD) 203 is formed over the semiconductor substrate 200. In some embodiments, the ILD 203 may include a dielectric layer 2031, a metal nitride layer 2032, an oxide layer 2033, or other suitable layers. These are, of course, merely examples and are not intended to be limiting. In some embodiments, the dielectric layer 2031 is formed on the semiconductor substrate 200. In some embodiments, the metal nitride layer 2032 is formed on the dielectric layer 2031. The metal nitride layer 2032 may include titanium nitride (TiN), tantalum nitride (TaN), or the like. In some embodiments, the oxide layer 2033 is formed on the metal nitride layer 2032. The oxide layer 2033 may include a silicon oxide ($SiO_x$), a germanium oxide ($GeO_2$), a nitrogen-bearing oxide (e.g., nitrogen-bearing $SiO_2$), a nitrogen-doped oxide (e.g., $N_2$-implanted $SiO_2$), or the like.

Referring to FIG. 2 and operation 102 in FIG. 1, a semiconductive layer 204 over the semiconductor substrate 200 is formed. In some embodiments, the semiconductive layer 204 is formed over the plurality of layers 203. The material of the semiconductive layer 204 may include silicon (Si), silicon germanium (SiGe), silicon carbide (SiC), silicon phosphide (SiP), silicon phosphorus carbide (SiPC), or other suitable semiconductor materials.

Figure 3:
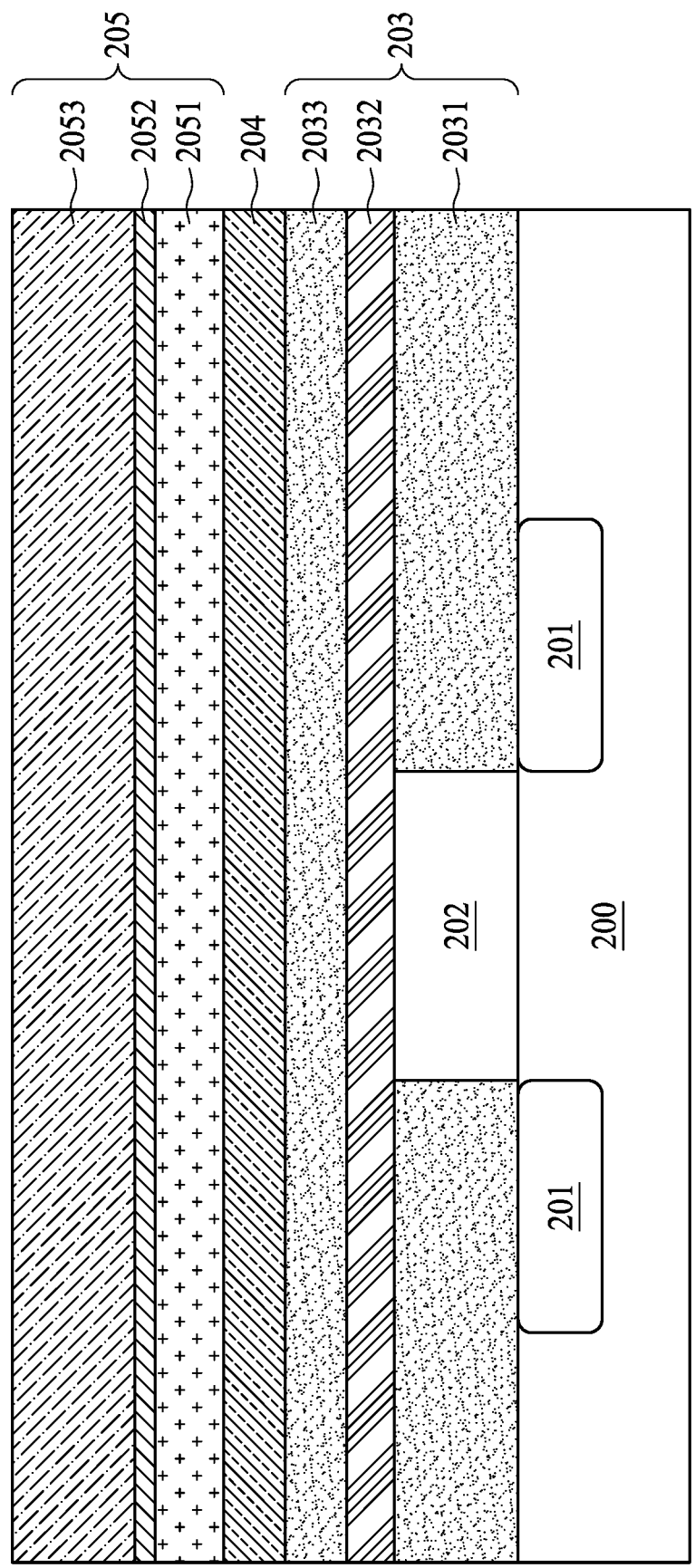

Referring to FIG. 3, in some embodiments, a mask such as a tri-layer mask 205 may be formed over the semiconductive layer 204. In some embodiments, the tri-layer mask 205 includes a bottom layer 2051, a middle layer 2052, and a top layer 2053. It is understood that in other embodiments, one or more layers of the tri-layer mask may be omitted, or additional layers may be provided as a part of the tri-layer mask, and the layers may be formed in difference sequences.

Figure 4:
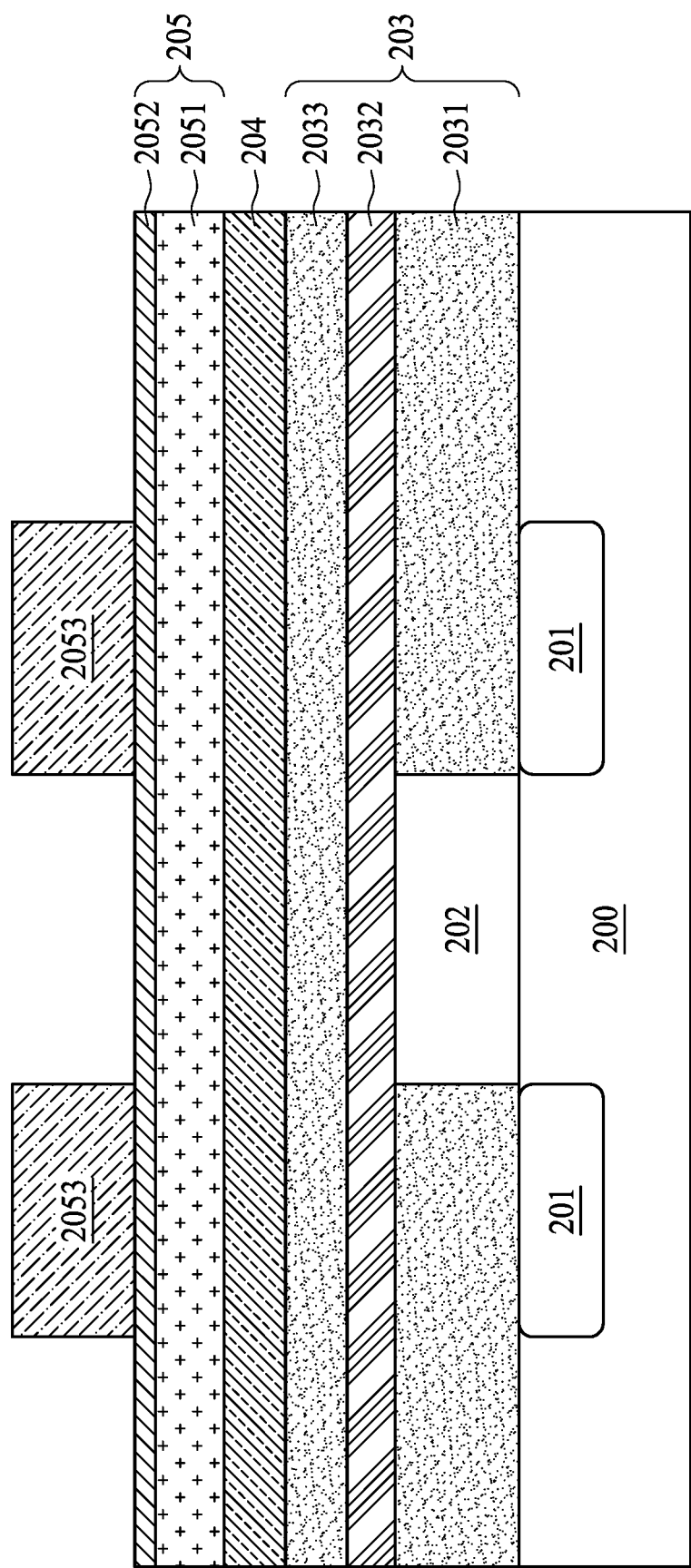
Figure 5:
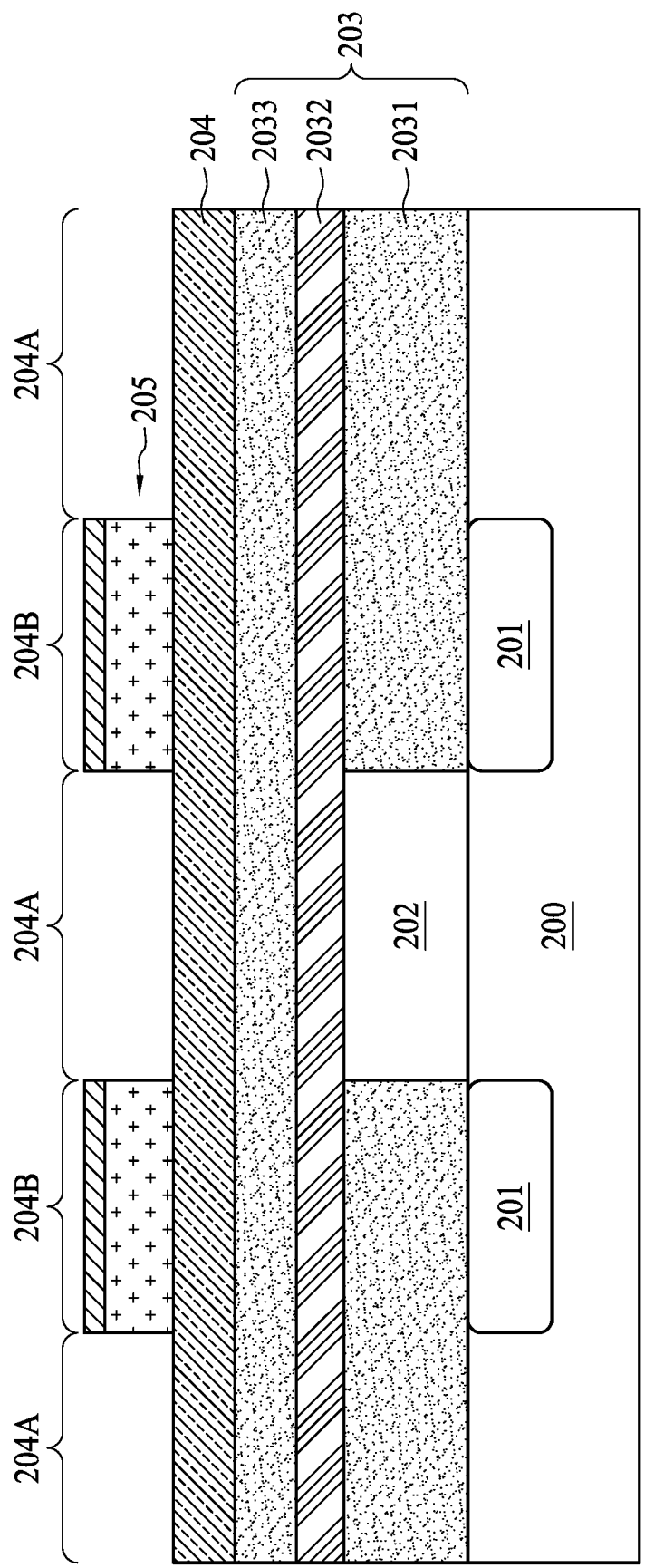

Referring to FIG. 4, in some embodiments, the top layer 2053 is patterned by a photolithography operation. In some embodiments, the photolithography operation patterns the top layer 2053 into a photoresist mask, which may have one or more trenches or openings that expose the middle layer 2052. Referring to FIG. 5, in some embodiments, one or more etching operations may be performed, and the top layer 2053 is used as a mask to etch the bottom layer 2051 and the middle layer 2052. The top layer 2053 is removed at the end of the etching operation. The bottom layer 2051 and the middle layer 2052 are unremoved to function as a mask layer for subsequent operation. The tri-layer mask 205 is patterned to expose first portions 204A of the semiconductive layer 204 and cover second portions 204B of the semiconductive layer 204.

Figure 6:
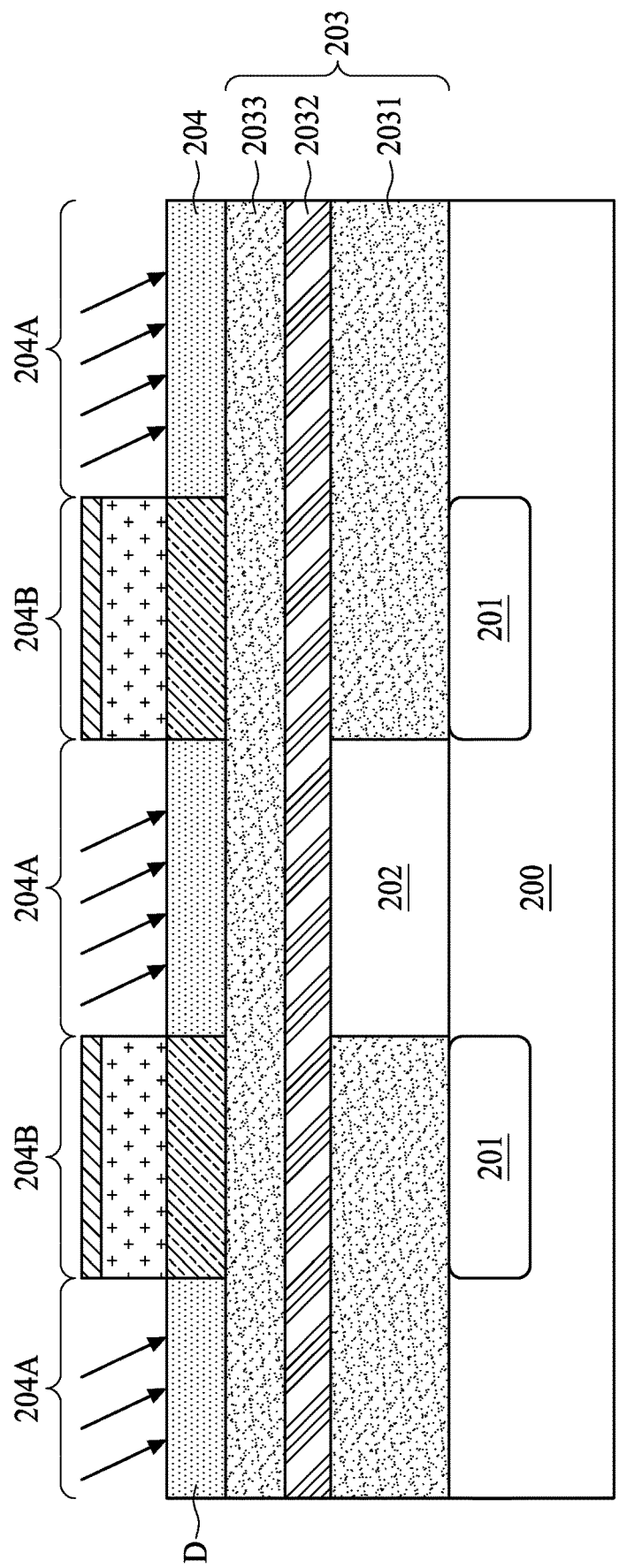

Referring to FIG. 6 and operation 103 in FIG. 1, a plurality of dopants D are formed in the first portions 204A of the semiconductive layer 204. In some embodiments, the plurality of dopants D include metallic dopants and/or semiconductive dopants. The dopants may include Boron (B), Phosphorus (P), Lanthanum (La), Ytterbium (Yb), Cerium (Ce), Gadolinium (Gd), Cadmium (Cd), or other suitable dopants, or a combination thereof. These are, of course, merely examples and are not intended to be limiting. In some embodiments, the plurality of dopants D are formed in the first portions 204A by performing an ion implantation. The dopants D may be implanted to the first portions 204A exposed from the tri-layer mask 205. In some embodiments, the covered second portions 204B are undoped.

Figure 10:
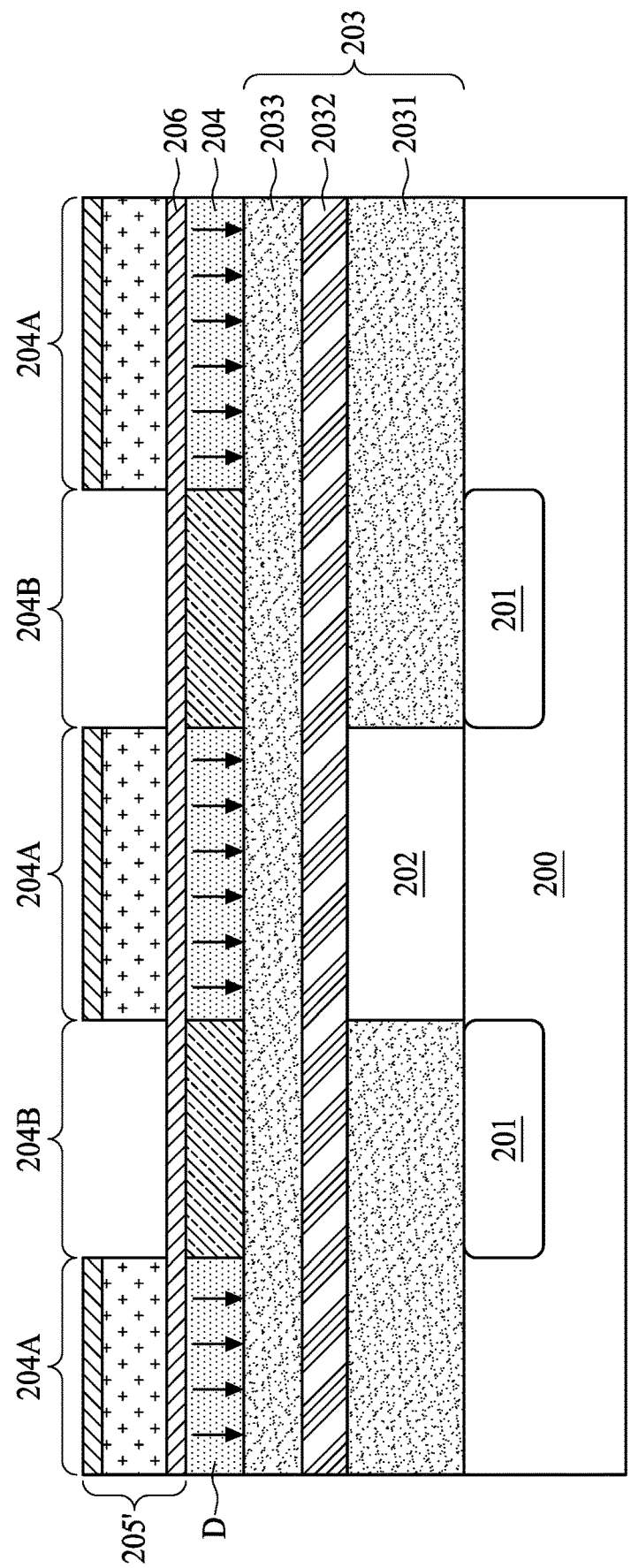
FIG. 10 is a cross-sectional view of a semiconductor device fabricated at some stages, in accordance with some embodiments of the present disclosure.

FIG. 10 is a cross-sectional view of a semiconductor device fabricated at some stages, in accordance with some embodiments of the present disclosure. Referring to FIG. 10, in some other embodiments, the plurality of dopants D may be formed by an imprinting operation. For example, a dopant source film 206 is formed on the semiconductive layer 204, and configured to imprint dopants into the semiconductive layer 204. In some embodiments, the dopant source film 206 is heated to imprint dopants into the semiconductive layer 204. For example, a thermal transferring pattern 205' may be formed over the dopant source film 206 to transfer heat to the dopant source film 206 during the imprinting operation. The tri-layer mask 205 described above may also be used as the thermal transferring pattern 205'. In some embodiments, the dopant source film 206 includes silicate glass film. In other embodiments, the dopant source film 206 may include phosphosilicate glass (PSG) film or borosilicate glass (BSG) film. The thermal transferring pattern 205' is formed according to doping requirement. In some embodiments, the thermal transferring pattern 205' is formed to cover the first portion 204A of the semiconductive layer 204 and expose the second portion 204B of the semiconductive layer 204. After the forming of the thermal transferring pattern 205', an thermal operation such as an annealing operation is performed to imprint the plurality of dopants D from the dopant source film 206 to the semiconductive layer 204. The annealing operation may transfer heat through the thermal transferring pattern 205' to the covered portions of the dopant source film 206. The dopants D of the dopant source film 206 may be driven into the semiconductive layer 204 in the first portion 204A during the annealing operation. In some embodiments, the exposed second portion 204B may be undoped.

Figure 7:
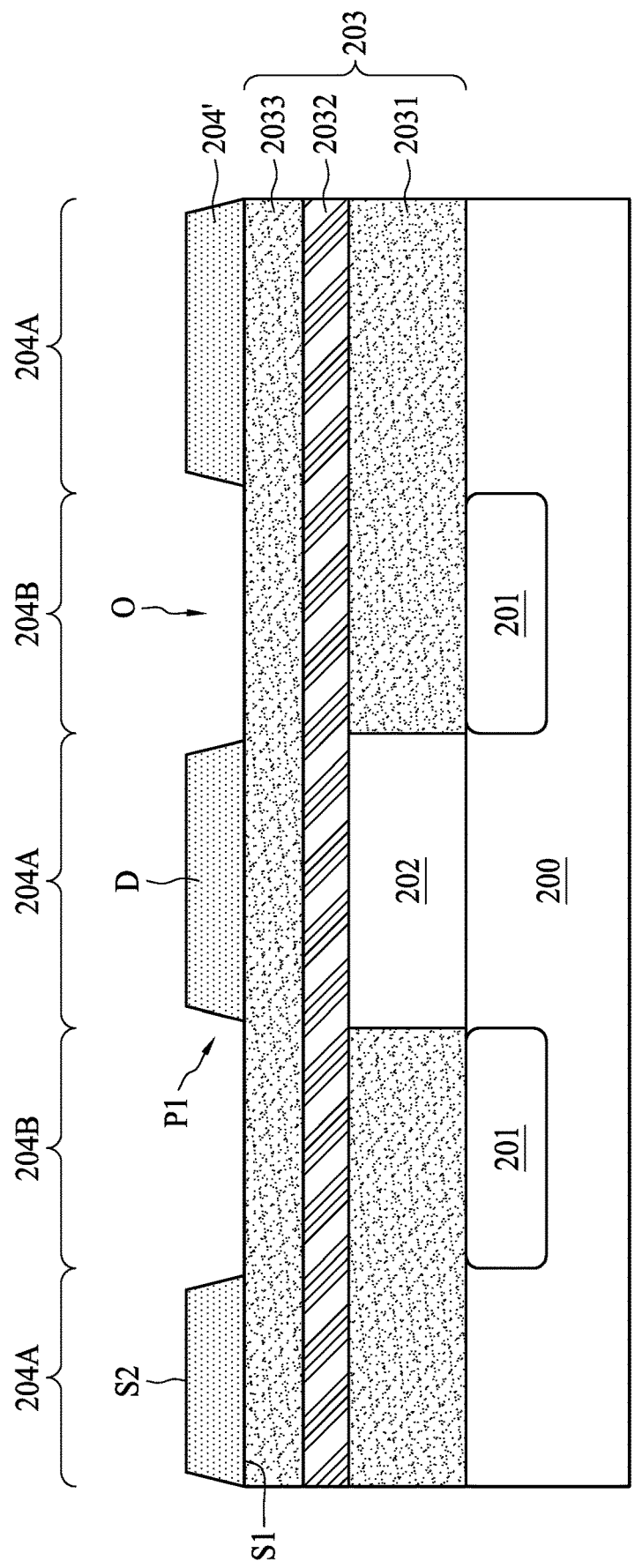

Referring to FIG. 7 and operation 104 in FIG. 1, the second portion 204B of the semiconductive layer 204 and the tri-layer mask 205 are removed to form a patterned semiconductive layer 204'. In some embodiments, the trilayer mask 205 may be removed by dry etching, wet etching, or a combination of dry and wet etching. In some embodiments, the doped first portion 204A may have higher etching resistance than the undoped second portion 204B. The second portion 204B of the semiconductive layer 204' may be removed by dry etching, wet etching, or a combination of dry and wet etching. In some embodiments, the second portion 204B may be removed by using $NH_4OH$, hydrofluoric acid (HF), tris-borate-ethylene diamine tetraacetic acid (TBE), the like, or a combination thereof.

In some embodiments, a distribution of the plurality of dopants D may control a sidewall profile P1 of the first portion 204A after removing the second portion 204B of the semiconductive layer 204'. The distribution of the plurality of dopants D in the first portion 204A may be adjusted during the doping operation. In some embodiments, the plurality of dopants D may be formed by multiple operations. For examples, the plurality of dopants D may be formed uniformly in the first portion 204A in the beginning, and then adjusting the concentration in different location of the semiconductive layer 204' by subsequent doping operations. In some embodiments, a doping dosage of forming the dopants D may be higher in the beginning and may be lower in the subsequent forming operations, and vice versa.

Referring to FIG. 7, in some embodiments, a concentration of the plurality of dopants D near a bottom surface si of the first portion 204A is higher than a concentration of the plurality of dopants D near a top surface S2 of the first portion 204A. In some embodiments, the concentration of the plurality of dopants D may gradually decrease from the bottom surface si to the top surface S2. In some embodiments, the sidewall profile P1 may be a trapezoidal cross-sectional shape. The bottom surface si of the first portion 204A is greater than the top surface S2 of the first portion 204A. In some embodiments, the sidewall profile P1 may define a gate trench or an opening profile O of the patterned semiconductive layer 204'. For examples, while the sidewall profile P1 has the trapezoidal cross-sectional shape, the opening profile O has an inverse trapezoidal cross-sectional shape. These are, of course, merely examples and are not intended to be limiting.

Figure 11C:
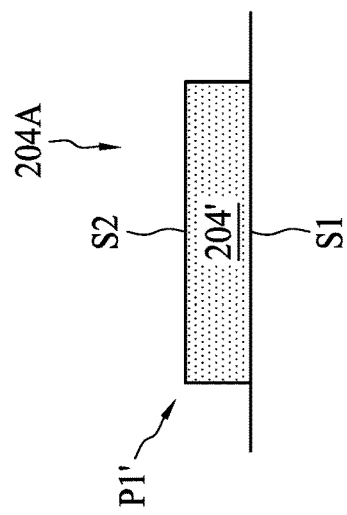
FIG. 11A, FIG. 11B, and FIG. 11C illustrate the sidewall profiles of the patterned semiconductive layer, in accordance with some embodiments of the present disclosure.
Figure 11B:
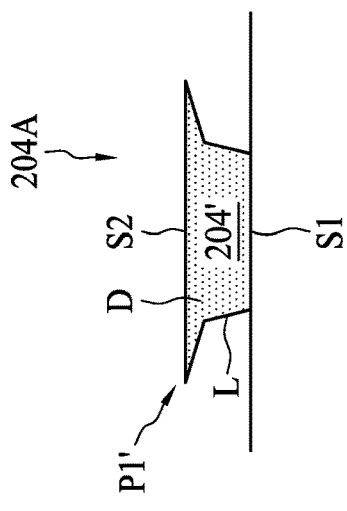
Figure 11A:
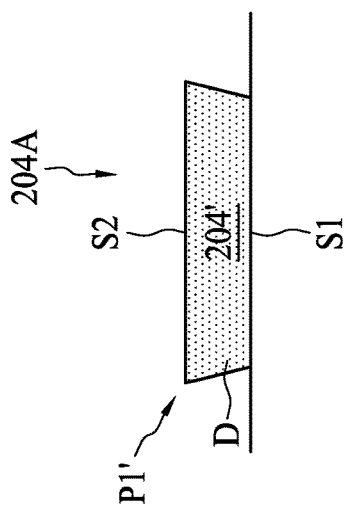

FIG. 11A, FIG. 11B, and FIG. 11C illustrate different sidewall profiles of the patterned semiconductive layer 204', in accordance with some other embodiments of the present disclosure. Referring to FIG. 11A, in some embodiments, a concentration of the plurality of dopants D near a top surface S2 of the first portion 204A of the patterned semiconductive layer 204' is higher than a concentration of the plurality of dopants D near a bottom surface S1 of the first portion 204A. The concentration of the plurality of dopants D may gradually decrease from the top surface S2 to the bottom surface S1. The sidewall profile P1' may be an inverse trapezoidal cross-sectional shape. The top surface S2 of the first portion 204A is greater than the bottom surface S1 of the first portion 204A.

Referring to FIG. 11B, in some embodiments, the concentration of the plurality of dopants D near the top surface S2 is highest and the concentration of the plurality of dopants D in other portion is uniform, a sidewall L of the sidewall profile P1' may be curved according to the distribution of the plurality of dopants D. In some embodiments, the sidewall L may be smoothly curved according to the distribution of the plurality of dopants D. In other embodiments, the sidewall L may include an included angle less than 180 degrees. In some embodiments, the sidewall L may have different slope at different sections according to the distribution of the plurality of dopants D. For examples, the slope of the sidewall L near the top surface S2 may be smaller than the slope of the sidewall L near the bottom surface S1. In other embodiments, the concentration of the plurality of dopants D near the bottom surface S1 may be highest, and the slope of the sidewall L near the top surface S2 may be smaller than the slope of the sidewall L near the bottom surface S1. These are, of course, merely examples and are not intended to be limiting.

Referring to FIG. 11C, in some embodiments, the plurality of dopants D may be formed uniformly in the first portion 204A. The sidewall profile P1' may be a rectangular or square cross-sectional shape. The bottom surface Si of the first portion 204A is substantially the same with the top surface S2 of the first portion 204A.

In one or more embodiments, a doping energy may also be adjusted to control the sidewall profile P1, P1' of the first portion 204A in FIG. 7, FIG. 11A, FIG. 11B, and FIG. 11C. In one or more embodiments, the doping energy of FIG. 7 may be higher than the doping energy of FIG. 11C, and the doping energy of FIG. 11C may be higher than the doping energy of FIG. 11A, and the doping energy of FIG. 11A may be similar to the doping energy of FIG. 11B. These are, of course, merely examples and are not intended to be limiting.

In one or more embodiments, an over etching (OE) rate in the removing operation of the second portion 204B may also control the sidewall profile P1, Pr of the first portion 204A in FIG. 7, FIG. 11A, FIG. 11B, and FIG. 11C. In one or more embodiments, the OE rate of FIG. 7 may be smaller than the OE rate of FIG. 11C, and the OE rate of FIG. 11C may be smaller than the OE rate of FIG. 11A, and the OE rate of FIG. 11A may be smaller than the OE rate of FIG. 11B. These are, of course, merely examples and are not intended to be limiting.

Figure 8:
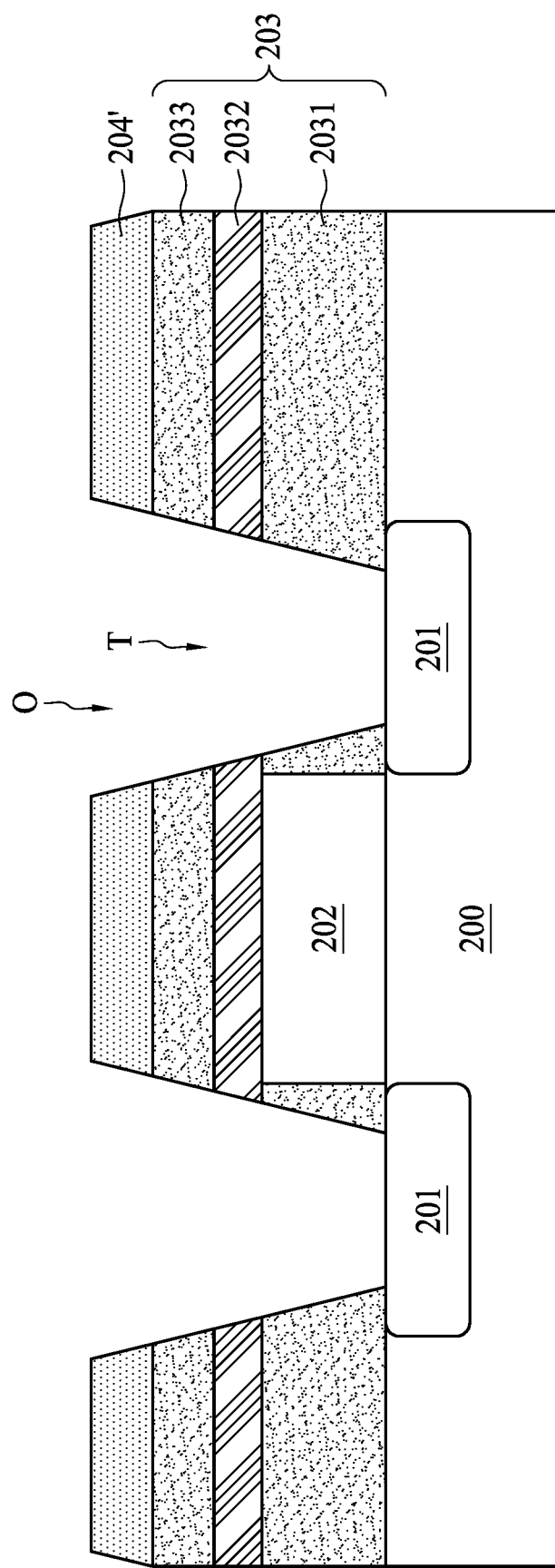

Referring to FIG. 8, in some embodiments, the patterned semiconductive layer 204' is used as a mask layer for patterning the ILD 203. The ILD 203 may be patterned by dry etching, wet etching, or a combination of dry and wet etching. In some embodiments, the opening profile O formed by the doped semiconductive layer 204' may be adjustable as described above, and thus the shape of the via hole T, trench, or gap formed through opening profile O may also be adjusted accordingly. In some embodiments, the via hole T may have, but not limited to, an inverse trapezoidal cross-sectional shape. In some embodiments, the opening width of the via hole T may be enlarged with the doped semiconductive layer 204'. In one or more embodiments, the via holes T may be positioned according to the source/drain regions 201, or gate 202. These are, of course, merely examples and are not intended to be limiting.

Figure 12A:
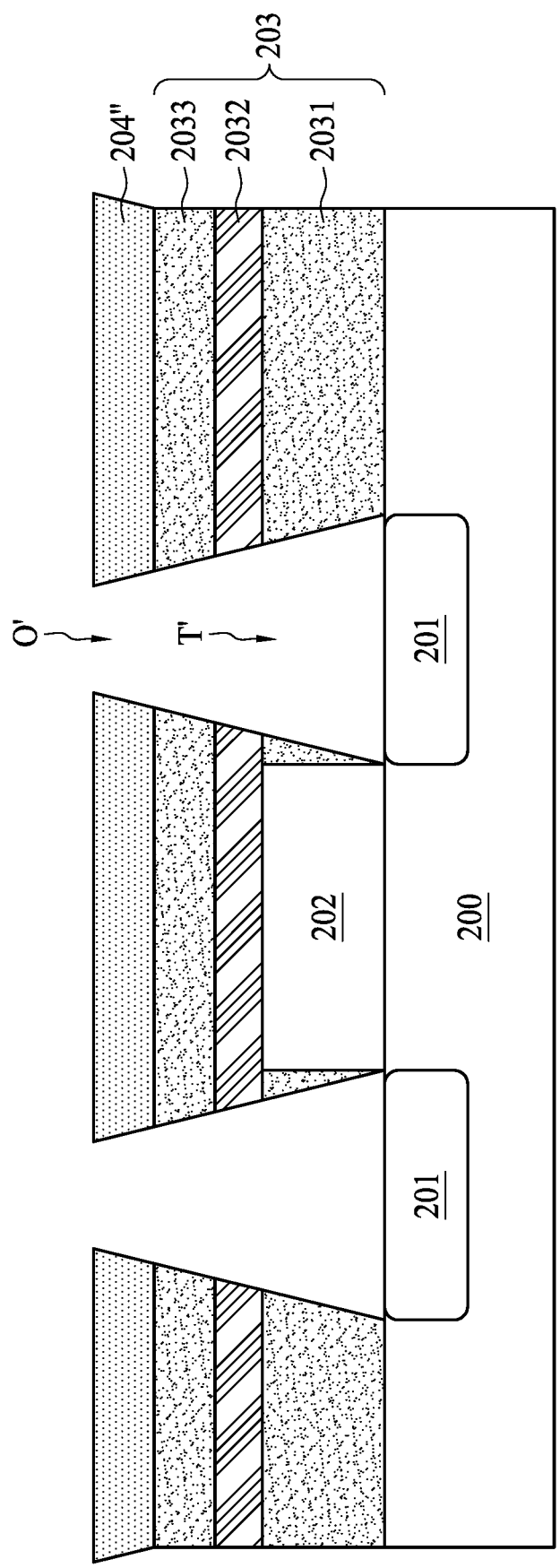
FIG. 12A and FIG. 12B illustrate the via hole according to different patterned semiconductive layer, in accordance with some embodiments of the present disclosure.
Figure 12B:
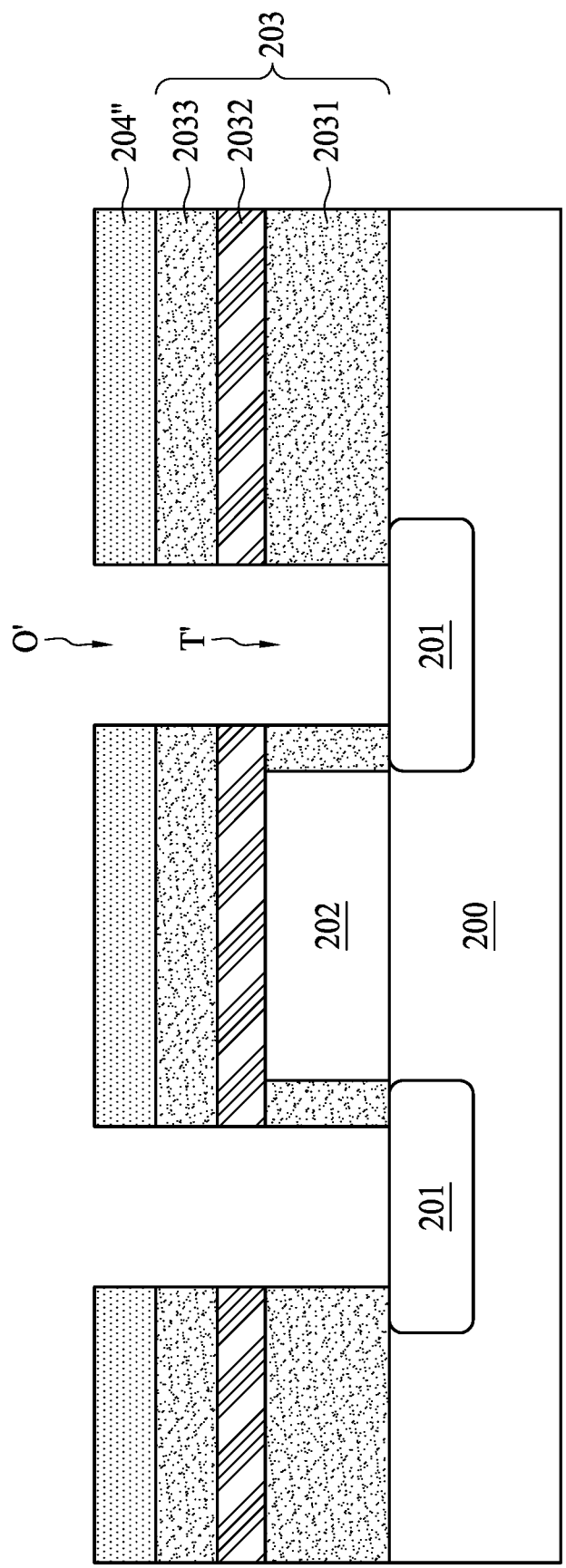

FIG. 12A and FIG. 12B illustrate different profiles of via hole T' according to different patterned semiconductive layer 204", in accordance with some embodiments of the present disclosure. Referring to FIG. 12A, the opening profile O' formed by semiconductive layer 204" may be a trapezoidal cross-sectional shape. The via hole T' may have, but not limited to, an trapezoidal cross-sectional shape. In some embodiments, the bottom width of the via hole T' may be enlarged with the doped semiconductive layer 204".

Referring to FIG. 12B, the opening profile O' formed by semiconductive layer 204" may be an rectangular cross-sectional shape. The via hole T' may have, but not limited to, an rectangular cross-sectional shape. In some embodiments, the bottom width of the via hole T' may be substantially the same with the opening width of the via hole T'.

Figure 9:
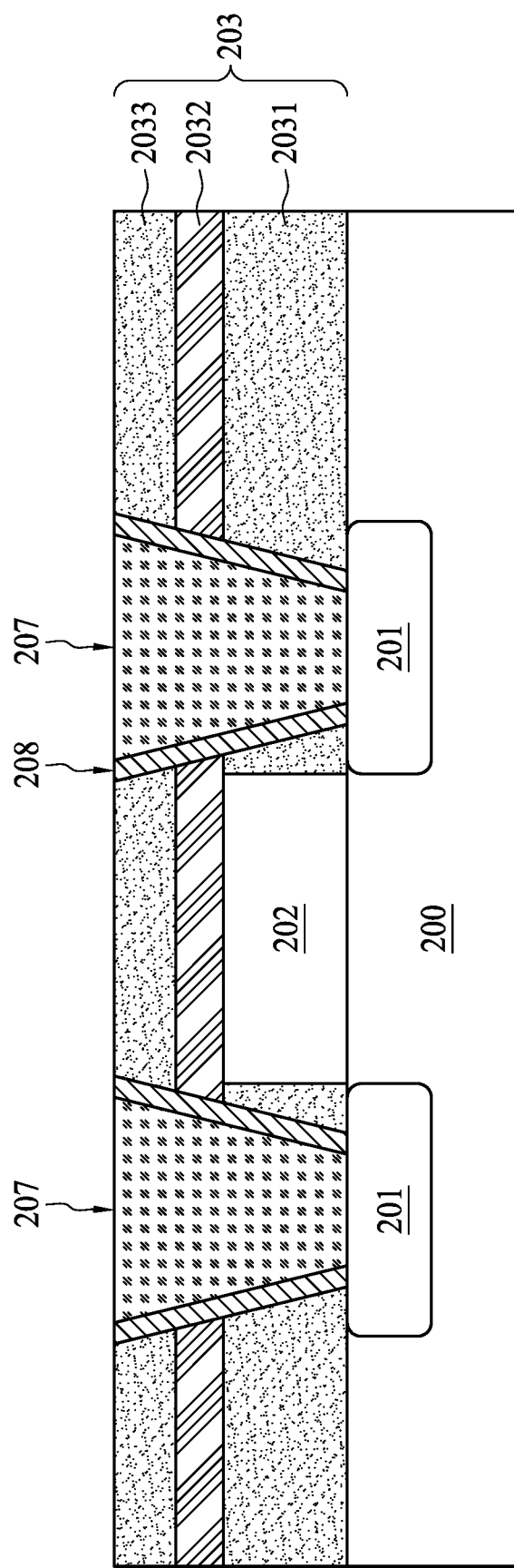

Referring to FIG. 9, in some embodiments, a metal layer 207 and a spacer layer 208 are formed in the via hole and the semiconductive layer 204' is removed. The metal layer 207 is electrically coupled to, but not limited to, the source/drain regions 201. In some embodiments, the spacer layer 208 include oxide (e.g. silicon oxide), nitride (e.g. silicon nitride), or the like. The spacer layer 208 may be a single layer structure or a multi-layer structure.

Briefly, a doped semiconductive layer may be used as a mask layer. In some embodiments of present disclosure, the sidewall profile of the patterned semiconductive layer may be adjustable according to the distribution of the dopants, and then an opening profile formed by the patterned semiconductive layer may be adjustable accordingly. In some embodiments, the opening profile may be enlarged to alleviate the bridge issue of the via hole in the subsequent operations.

Figure 13:
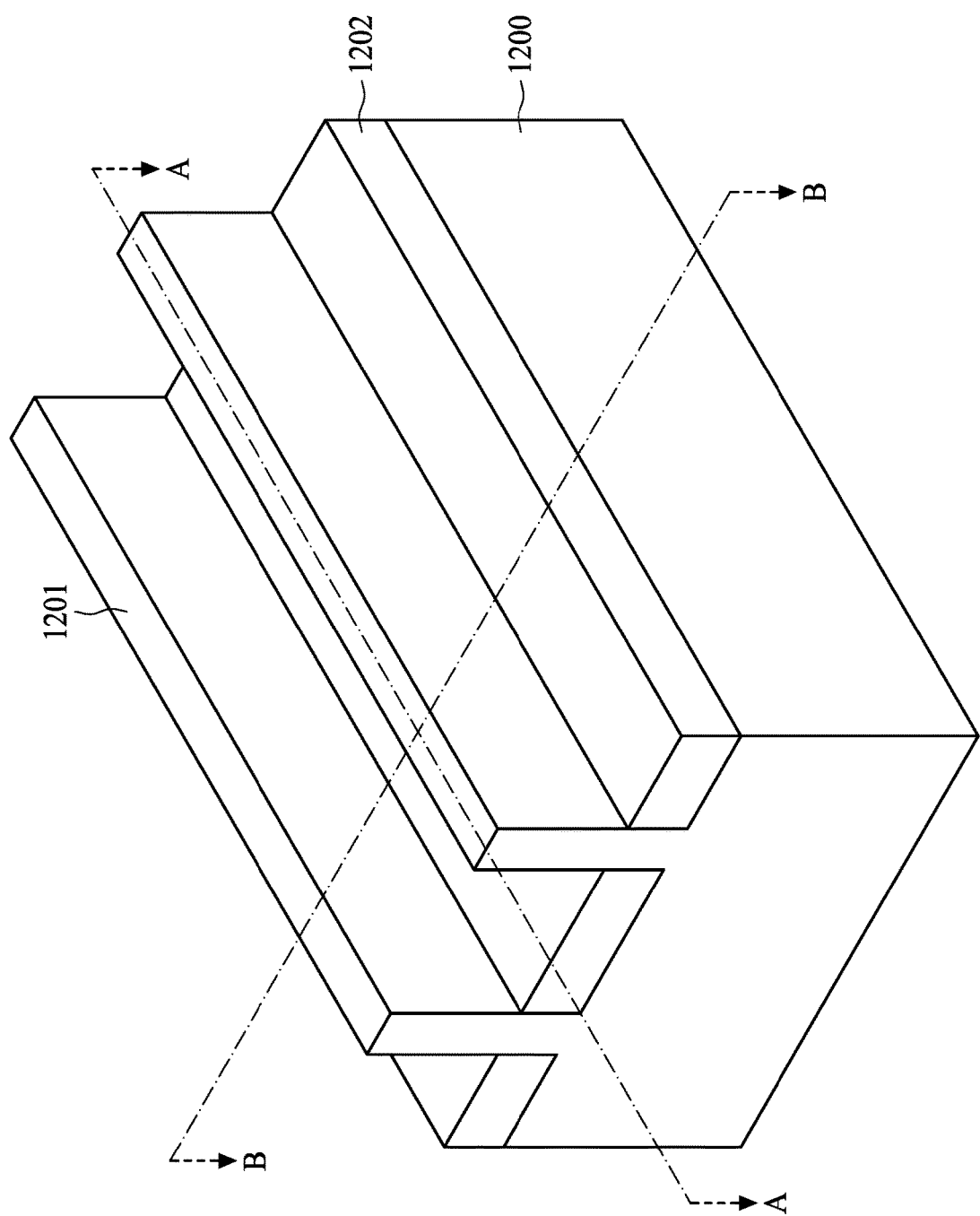
FIG. 13 is a perspective view of a semiconductor device fabricated at some stages, in accordance with some embodiments of the present disclosure.

FIG. 13 is a perspective view of a semiconductor device fabricated at some stages, in accordance with some embodiments of the present disclosure. In some embodiments, the semiconductor device includes a fin structure. The fin structure may be formed by a series of operations, and here is omitted for brevity. In some embodiments, a plurality of fin regions 1201 and an oxide layer 1202 are formed on the semiconductor substrate 1200.

In some embodiments, a gate structure is formed on the fin regions 1201. The operations of forming the gate structure are discussed in detail below using the cross-sectional views along line A-A and line B-B.

Figure 14A:
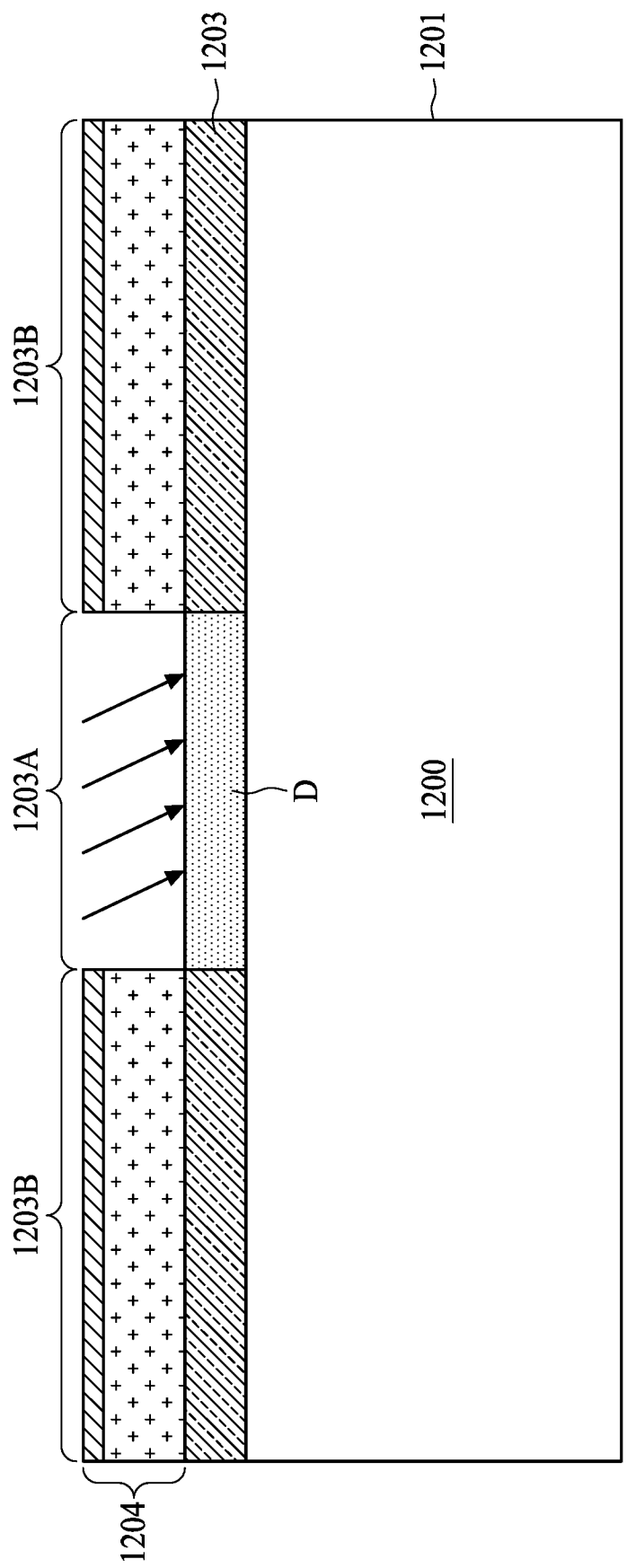
FIG. 14A and FIG. 15A are cross-sectional views of a semiconductor device fabricated at some stages along the line A-A in FIG. 13, in accordance with some embodiments of the present disclosure.
Figure 14B:
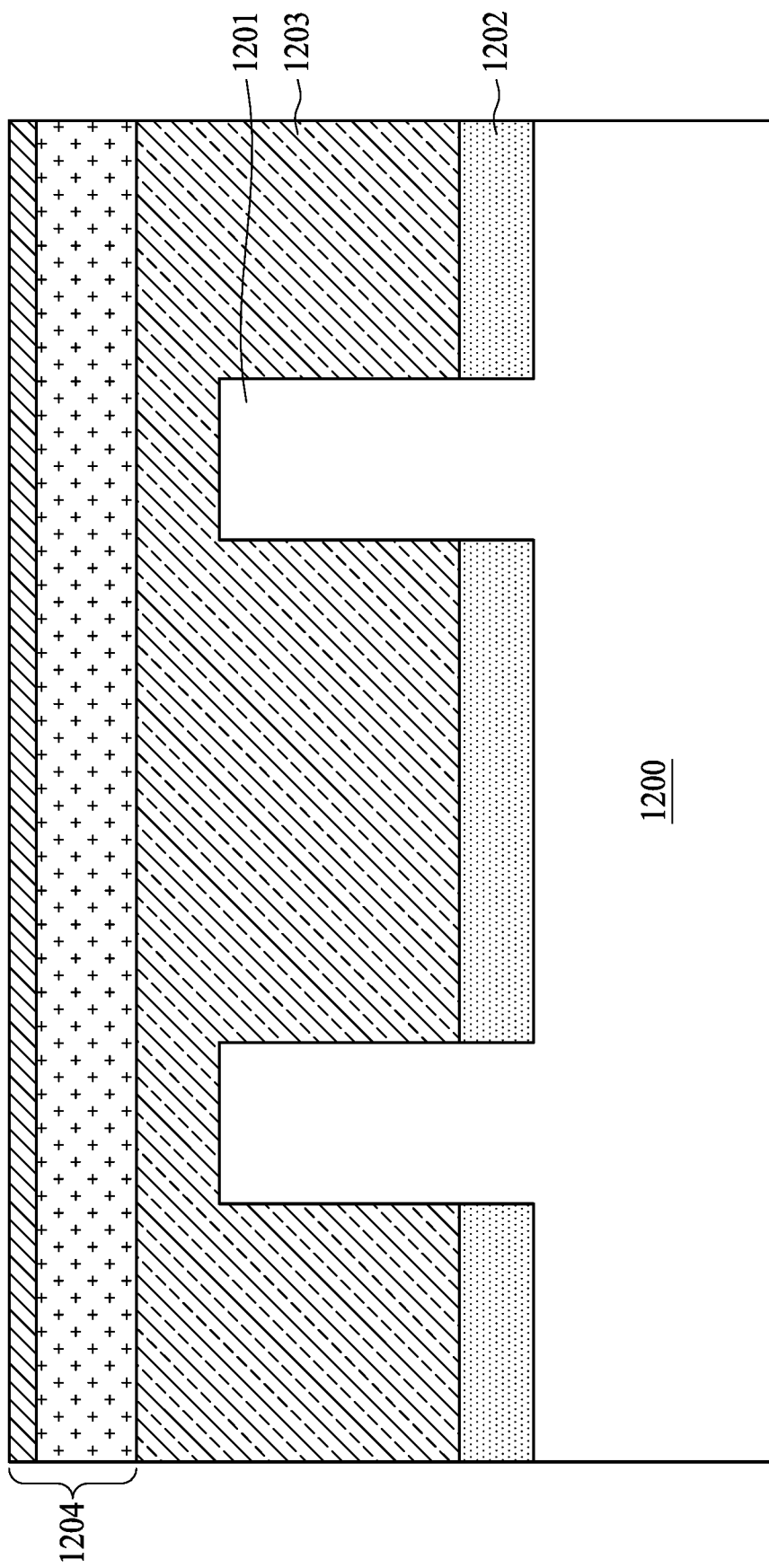
FIG. 14B and FIG. 15B are cross-sectional views of a semiconductor device fabricated at some stages along the line B-B in FIG. 13, in accordance with some embodiments of the present disclosure.
Figure 15A:
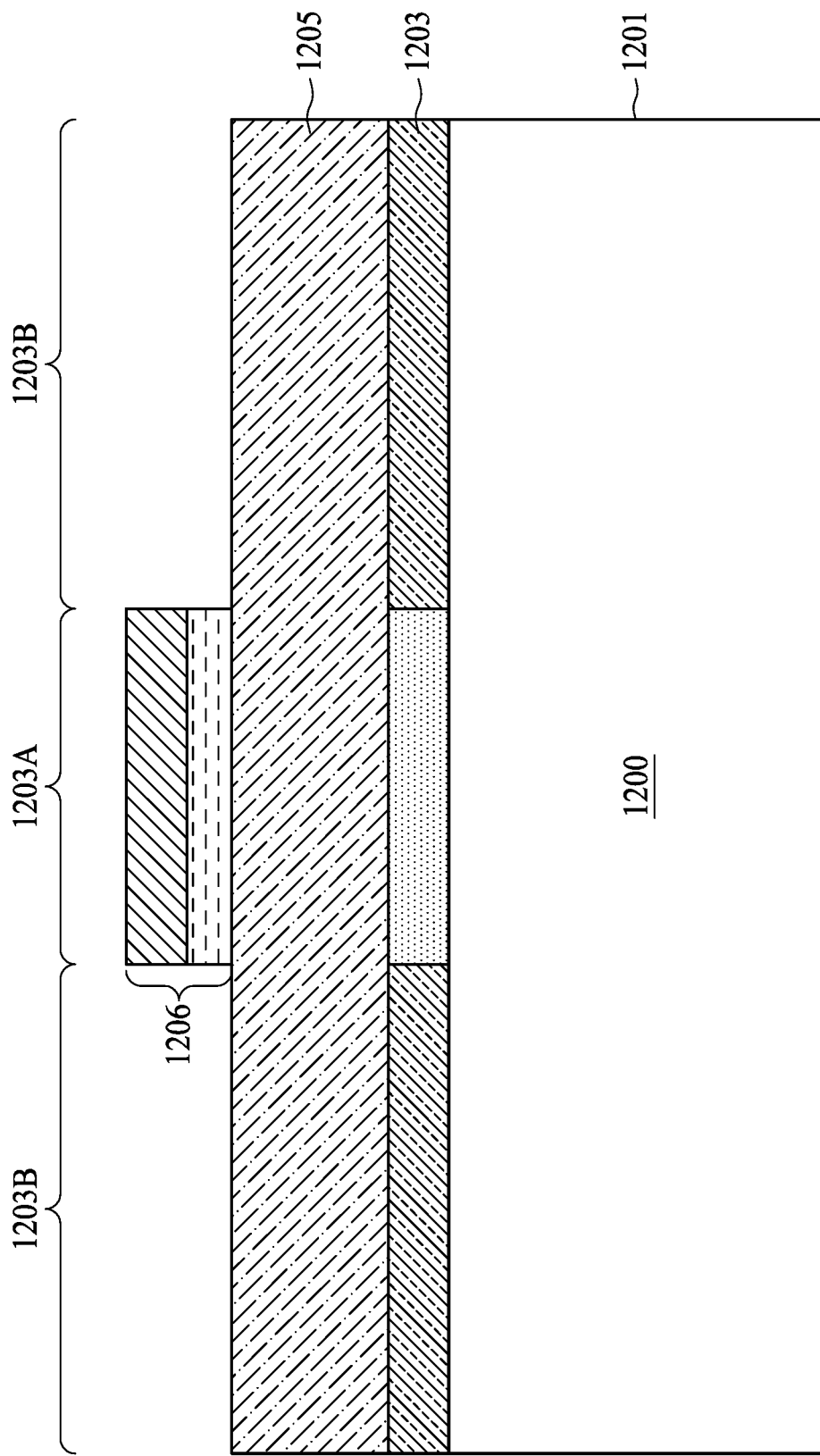
Figure 15B:
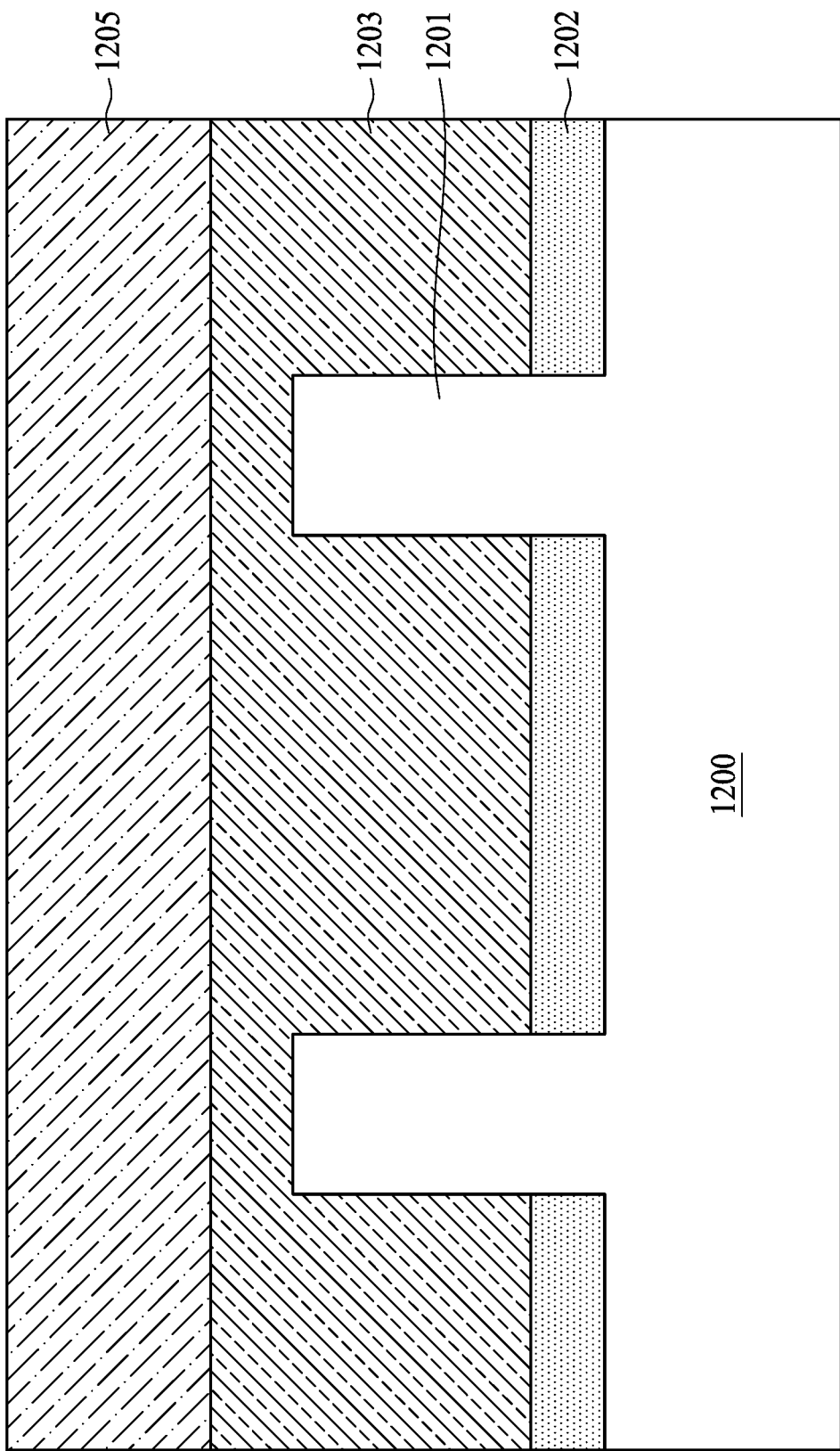

FIG. 14A and FIG. 15A are cross-sectional views of a semiconductor device fabricated at some stages along the line A-A in FIG. 13, in accordance with some embodiments of the present disclosure. FIG. 14B and FIG. 15B are cross-sectional views of a semiconductor device fabricated at some stages along the line B-B in FIG. 13, in accordance with some embodiments of the present disclosure. It is noted that the line A-A is along with fin region and the B-B line crosses the fin regions and does not include the gate structure formed in the subsequent operations.

Referring to FIG. 14A and FIG. 14B, similar to the operations in FIG. 2 to FIG. 6, a semiconductive layer 1203 is formed over the semiconductor substrate 1200, and a tri-layer mask 1204 is formed and patterned over the semiconductive layer 1203, and a plurality of dopants D are formed in the first portions 1203A of the semiconductive layer 1203. The semiconductive layer 1203, tri-layer mask 1204, and dopants D are similar to the semiconductor 204, tri-layer mask 205, and dopants D in FIG. 6, and here is omitted for brevity.

Referring to FIG. 15A and FIG. 15B, in some embodiments, before the removing of the second portion 1203B of the doped semiconductive layer 1203, a semiconductive layer 1205 and a plurality of mask layers 1206 are formed on the semiconductive layer 1203. The semiconductive layer 1205 may include silicon (Si), silicon germanium (SiGe), silicon carbide (SiC), silicon phosphide (SiP), silicon phosphorus carbide (SiPC), or other suitable semiconductor materials. In some embodiments, the semiconductive layer 1205 may include the same or different materials from the semiconductive layer 1203. In some embodiments, the semiconductive layer 1205 is not doped as the semiconductive layer 1203. In other embodiments, the semiconductive layer 1205 may be doped with a different dopant distribution from the semiconductive layer 1203. Briefly, the semiconductor layer 1203 and 1205 are formed to have different properties for the subsequent etching operations.

In some embodiments, the mask layers 1206 may include a tetraethosiloxane (TEOS) layer, a nitride layer (e.g. silicon nitride), or a multi-layer structure with a combination thereof. The mask layers 1206 is patterned to be aligned with the first portion 1203A of the semiconductive layer 1203.

Figure 16:
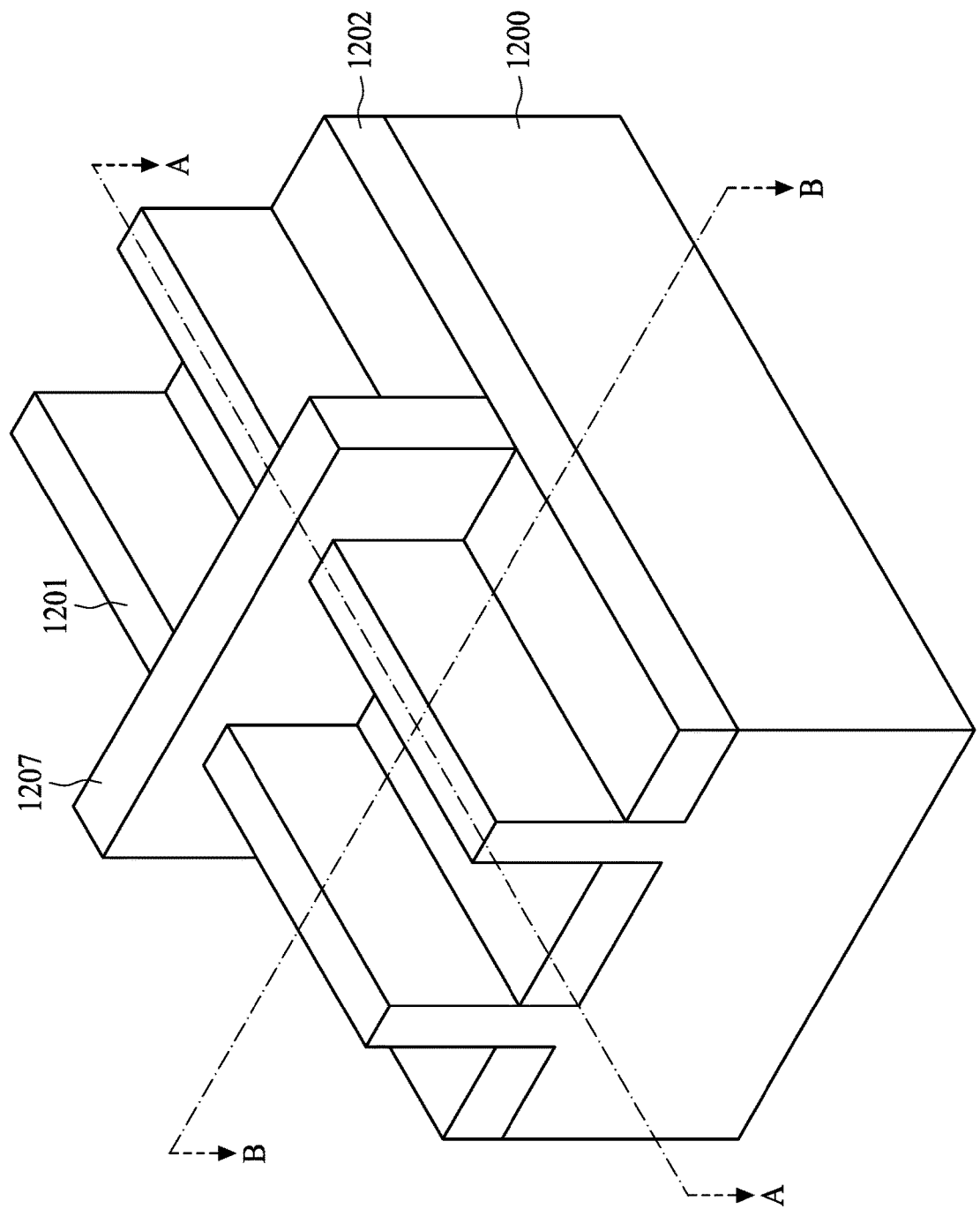
FIG. 16 is a perspective view of a semiconductor device fabricated at some stages, in accordance with some embodiments of the present disclosure.

FIG. 16 is a perspective view of a semiconductor device fabricated at some stages, in accordance with some embodiments of the present disclosure. FIG. 17A, FIG. 18A, FIG. 19A, FIG. 20A, FIG. 21A and FIG. 22A are cross-sectional views of a semiconductor device fabricated at some stages along the line A-A in FIG. 16, in accordance with some embodiments of the present disclosure. FIG. 17B, FIG. 18B, FIG. 19B, and FIG. 22B are cross-sectional views of a semiconductor device fabricated at some stages along the line B-B in FIG. 16, in accordance with some embodiments of the present disclosure.

Figure 17A:
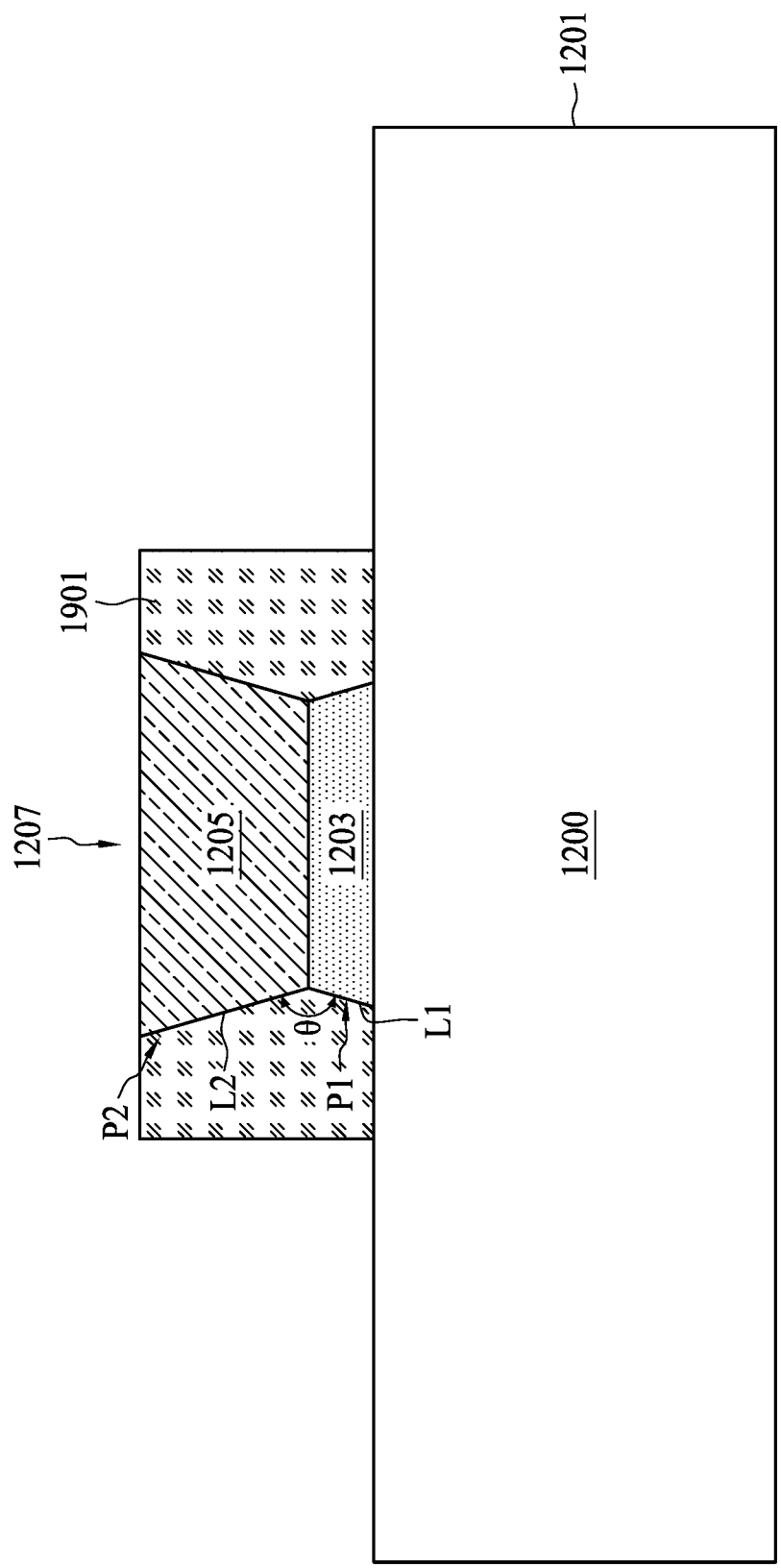
FIG. 17A, FIG. 18A, FIG. 19A, FIG. 20A, FIG. 21A and FIG. 22A are cross-sectional views of a semiconductor device fabricated at some stages along the line A-A in FIG. 16, in accordance with some embodiments of the present disclosure.
Figure 17B:
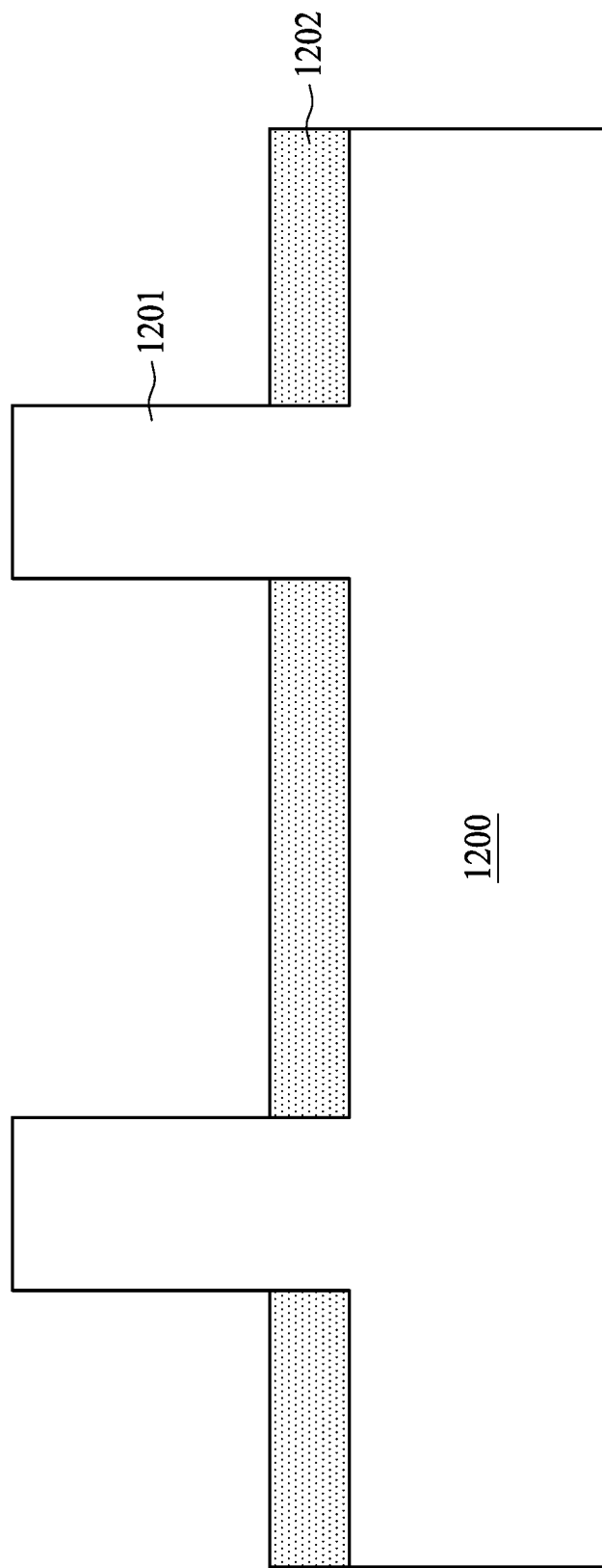
FIG. 17B, FIG. 18B, FIG. 19B and FIG. 22B are cross-sectional views of a semiconductor device fabricated at some stages along the line B-B in FIG. 16, in accordance with some embodiments of the present disclosure.

Referring to FIG. 16, FIG. 17A and FIG. 17B, a dummy gate structure 1207 is formed on the fin regions 1201. The dummy gate structure 1207 includes the patterned semiconductive layers 1203 and 1205. In some embodiments, a spacer 1901 is formed on two opposite sides of the dummy gate structure 1207. The spacer 1901 may be made of dielectric material such as oxide, nitride or the like. The spacer 1901 may be single-layered or multi-layered.

The forming of the patterned semiconductive layer 1203 is similar to FIG. 7, FIG. 11A, FIG. 11B, and FIG. 11C, and omitted here for brevity. In some embodiments, the semiconductive layer 1205 may be patterned by dry etching, wet etching, or a combination of dry and wet etching. The semiconductive layer 1205 may be patterned in the same or different operation from the semiconductive layer 1203. The mask layers 1206 are removed after the semiconductive layer 1203 and 1205 are patterned.

In some embodiments, a sidewall profile P2 of the patterned semiconductive layer 1205 is different from the sidewall profile P1 of the patterned semiconductive layer 1203. The sidewall profile P2 may be an inverse trapezoidal cross-sectional shape and the sidewall profile P1 may be a trapezoidal cross-sectional shape. In some embodiments, an angle θ between a sidewall L1 of the patterned semiconductive layer 1203 and a sidewall L2 of the patterned semiconductive layer 1205 is smaller than 180 degrees. The combination of the sidewall profile P1 and sidewall profile P2 is used as the dummy gate structure 1207. In some embodiments, the combined shape of the sidewall profile P1 and sidewall profile P2 is an hourglass shape. These are, of course, merely examples and are not intended to be limiting. In some embodiments, the combined shape of the sidewall profile P1 and sidewall profile P2 may have other different combinations depending on the desired configuration.

Figure 23A:
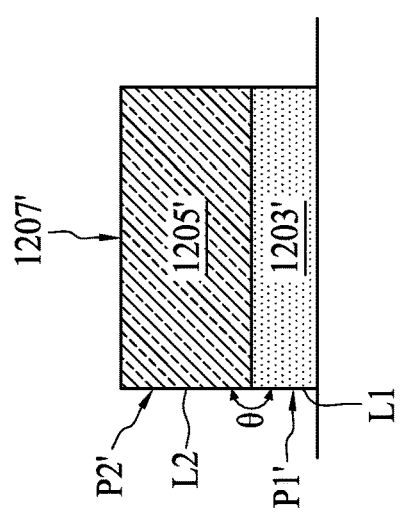
FIG. 23A, FIG. 23B and FIG. 23C illustrate the sidewall profiles of the patterned semiconductive layer, in accordance with some embodiments of the present disclosure.
Figure 23B:
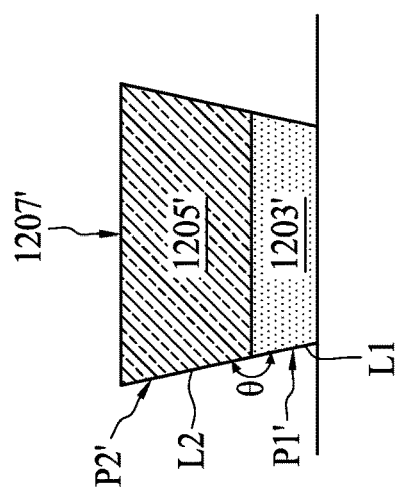
Figure 23C:
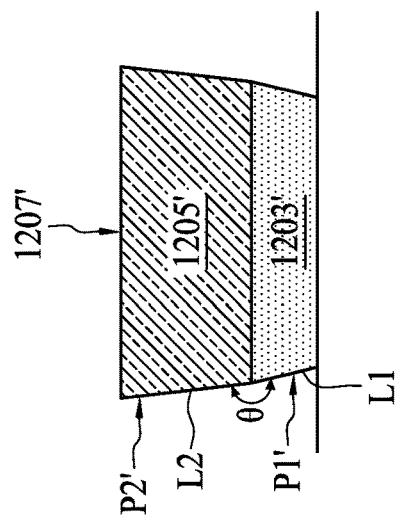

FIG. 23A, FIG. 23B and FIG. 23C illustrate different sidewall profiles of the patterned semiconductive layer 1203' and 1205', in accordance with some embodiments of the present disclosure. Referring to FIG. 23A, in some embodiments, the sidewall profile P1' may be a rectangular or square cross-sectional shape. The sidewall profile P2' may be a rectangular or square cross-sectional shape. In some embodiments, an angle θ between the sidewall L1 of the patterned semiconductive layer 1203' and the sidewall L2 of the patterned semiconductive layer 1205' may be substantially equal to 180 degrees. In some embodiments, the dummy gate structure 1207' is a rectangular or square shape.

Referring to FIG. 23B, in some embodiments, the sidewall profile P1' and P2' may be an inverse trapezoidal cross-sectional shape. In some embodiments, an angle θ between the sidewall L1 of the patterned semiconductive layer 1203' and the sidewall L2 of the patterned semiconductive layer 1205' may be substantially equal to 180 degrees. In some embodiments, the dummy gate structure 1207' is a tapered rectangular shape.

Referring to FIG. 23C, in some embodiments, the sidewall profile P1' and P2' may be an inverse trapezoidal cross-sectional shape. The difference between FIG. 23B and FIG. 23C is that an angle θ between a sidewall L1 of the patterned semiconductive layer 1203' and the sidewall L2 of the patterned second semiconductive layer 1205' may be greater than 180 degrees in FIG. 23C.

Figure 18A:
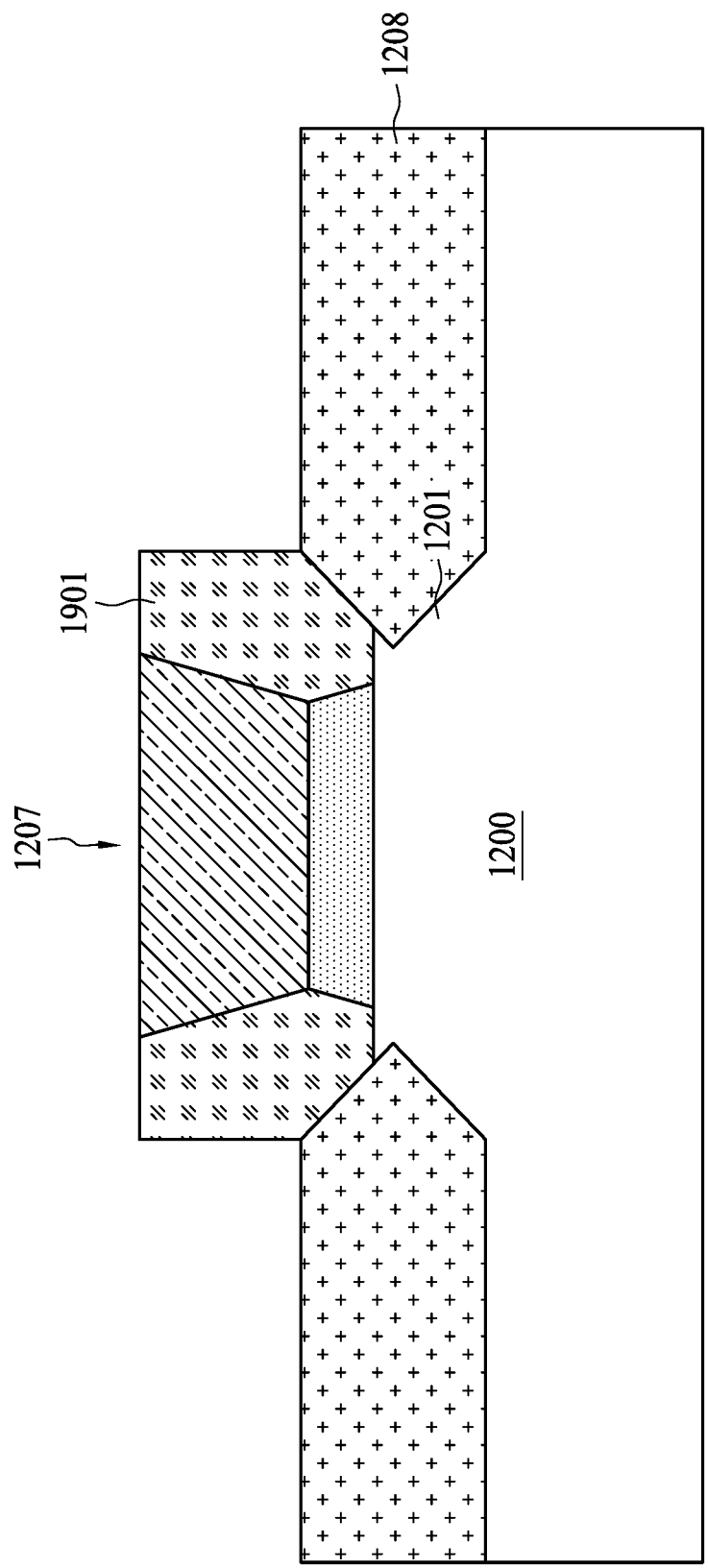
Figure 18B:
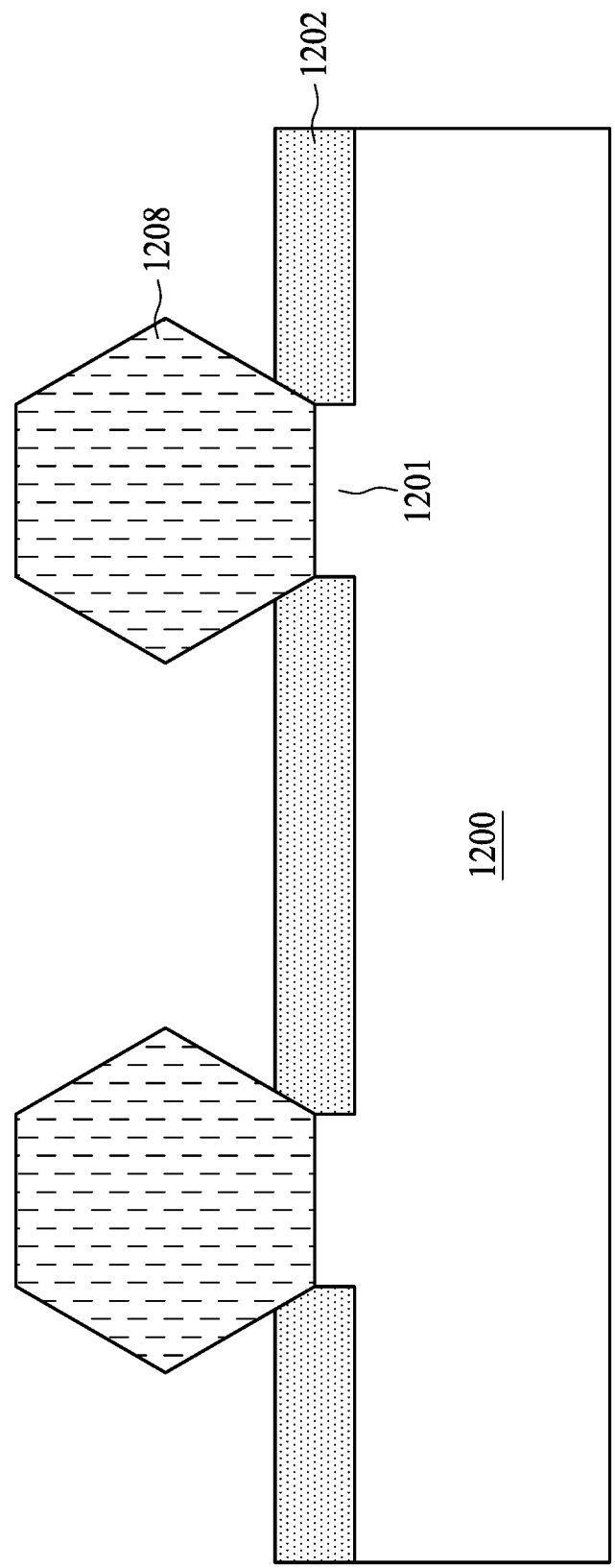

Referring to FIG. 18A and FIG. 18B, in some embodiments, the fin regions 1201 of semiconductor substrate 1200 uncovered by the patterned semiconductive layer 1207 are partially removed. A recess may be formed on the fin regions 1201 and a semiconductor is deposited on the recess of the fin regions 1201 to form a pair of source/drain regions 1208. The source/drain regions 1208 may be deposited by epitaxial growth. In some embodiments, the source/drain regions 1208 is selected to have a larger or smaller lattice constant than the semiconductor of the channel region.

Figure 19A:
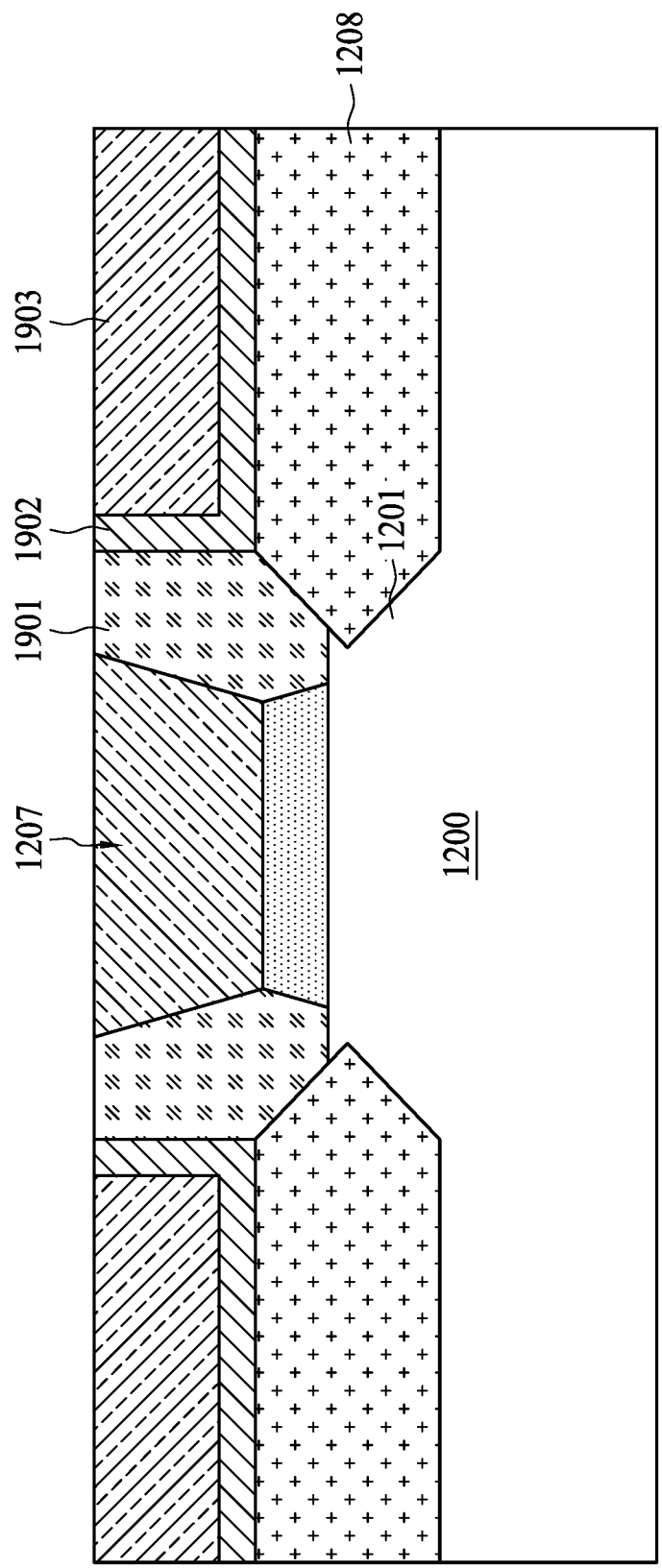
Figure 19B:
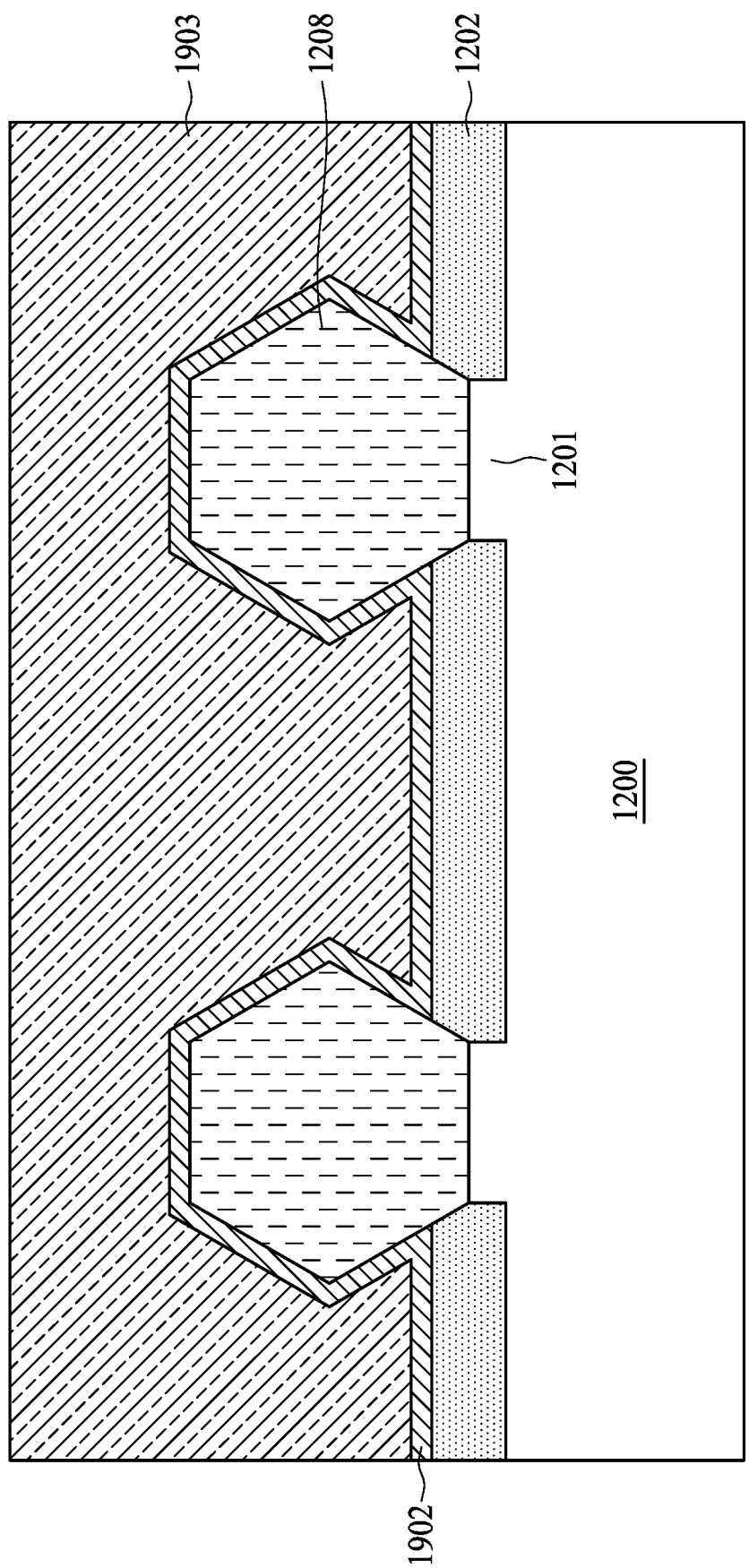
Figure 20A:
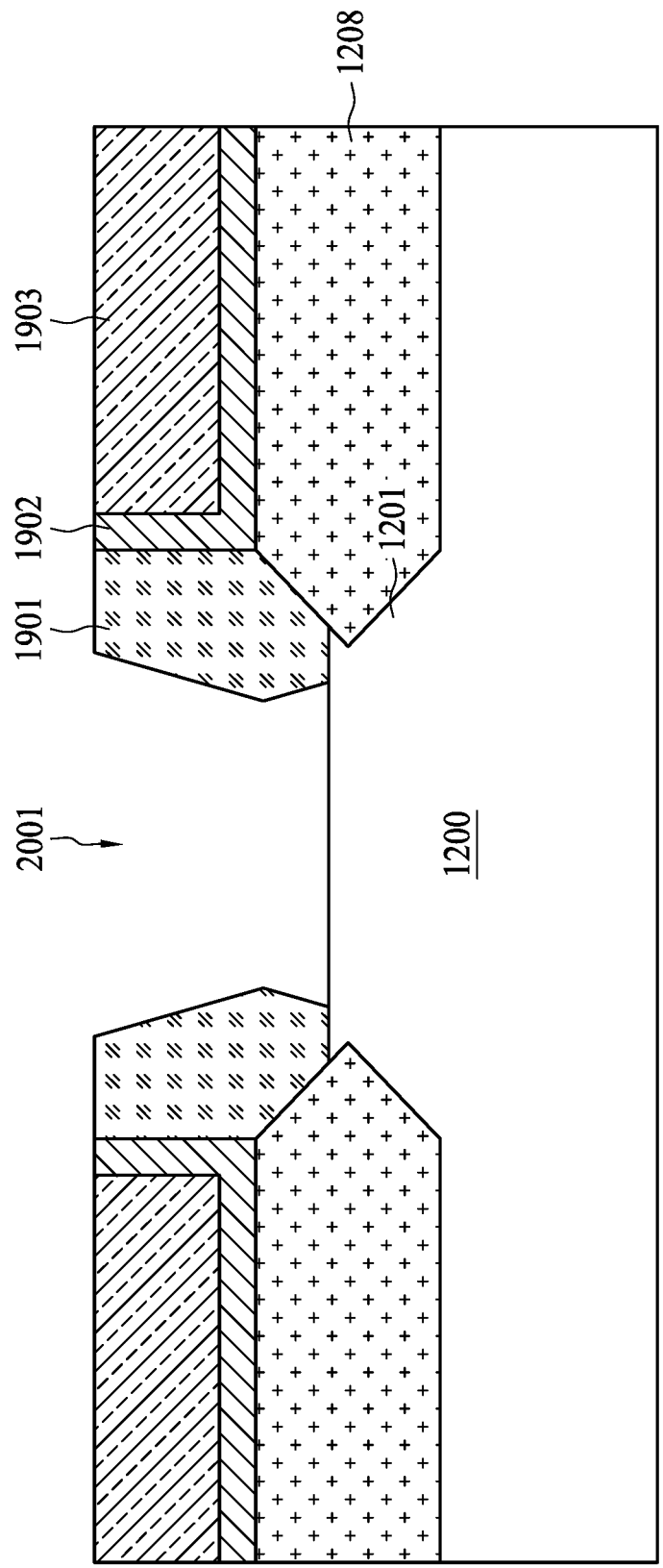

Referring to FIG. 19A and FIG. 19B, a contact etch stop layer (CESL) 1902 and a dielectric layer 1903 are formed. The CESL 1902 may be formed of silicon nitride (SiN), silicon oxynitride (SiON), and/or other suitable materials. The dielectric layer 1903 may be an inter-layer dielectric (ILD). The dielectric layer 1903 may include silicon oxide ($SiO_x$), silicon oxynitride (SiON), or a low k material. These are, of course, merely examples and are not intended to be limiting. In some embodiments, there may be more intermediate layers formed in-between. The CESL 1902 and the dielectric layer 1903 may be partially removed, for example by a chemical mechanical polish (CMP) or the like, to expose the dummy gate structure. Referring to FIG. 20A, in some embodiments, the dummy gate structure is removed to form a gate trench 2001.

Figure 21A:
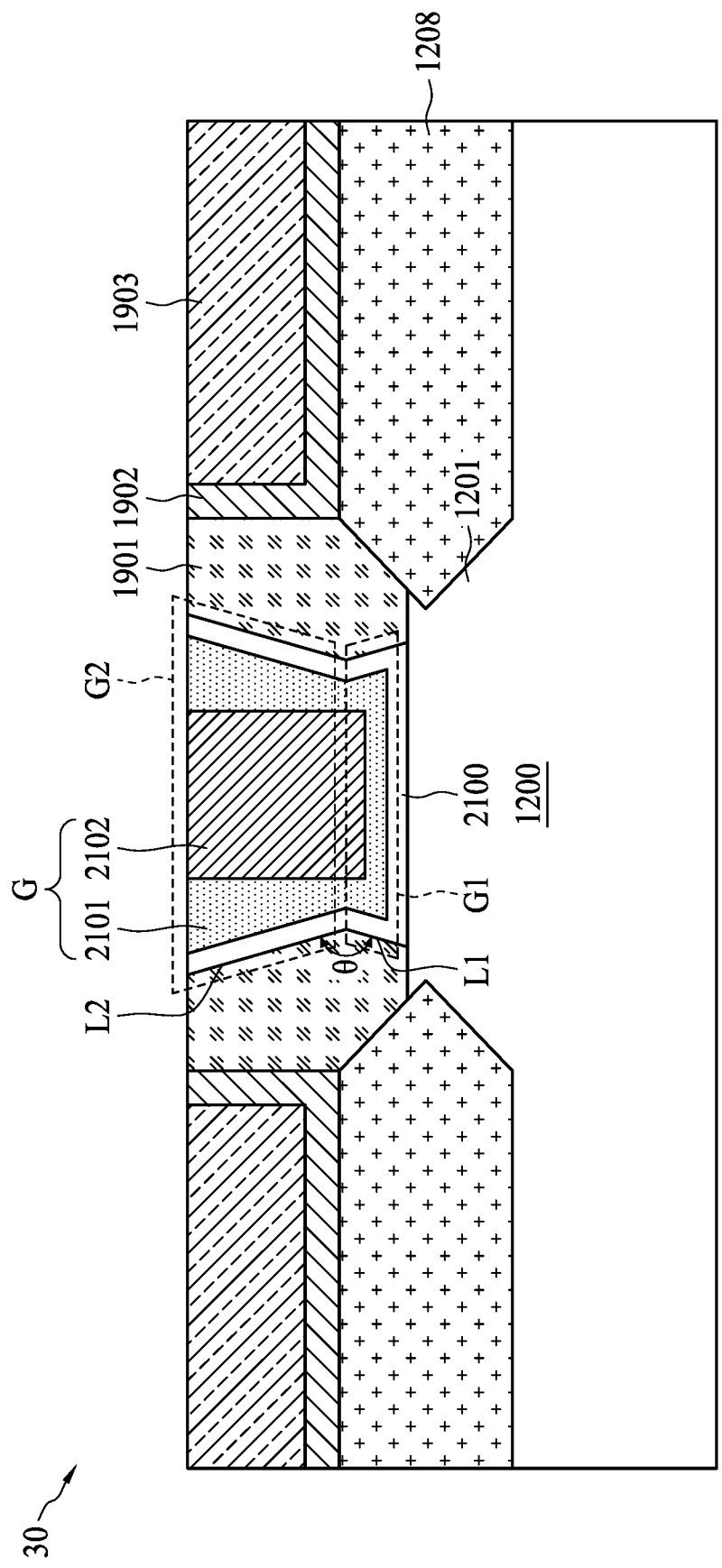

Referring to FIG. 21A, in some embodiments, a gate dielectric 2100, a work function metal 2101 and a metal gate fill material 2102 may be formed in the gate trench 2001. A planarization operation such as CMP operation is then performed to remove excessive work function metal 2101 and metal gate fill material 2102 over the dielectric layer 1903, forming the gate structure G. In some embodiments, the planarization may remove materials deposited outside of the trench structure. In some embodiments, the gate structure G includes the work function metal 2101 and the metal gate fill material 2102 functioned as gate electrode.

The work function metal 2101 may be a multi-layer structure. In some embodiments, the work function metal 2101 may be any metal material suitable for forming a metal gate or portion thereof, including work function layers, liner layers, interface layers, seed layers, adhesion layers, barrier layers, etc. The work function metal 2101 may include one or more layers including Titanium (Ti), Titanium Nitride (TiN), Tantalum Nitride (TaN), Tantalum (Ta), Tantalum Carbide (TaC), Tantalum Silicon Nitride (TaSiN), Tungsten (W), Tungsten Nitride (WN), Molybdenum Nitride (MoN), Molybdenum Oxide Nitride (MoON), Ruthenium Oxide ($RuO_2$), and/or other suitable materials. The metal gate fill material 2102 may be deposited to substantially or completely fill the remainder of the trench. In some embodiments, the metal gate fill material 2102 may include titanium nitride (TiN), tungsten (W), titanium (Ti), aluminum (Al), tantalum (Ta), tantalum nitride (TaN), cobalt (Co), copper (Cu), nickel (Ni), and/or other suitable materials.

The gate structure G of the semiconductor device 30 may include a bottom portion G1 and a top portion G2 over the bottom portion G1. In some embodiments, the sidewall L1 of the bottom portion G1 is oblique to a top surface 1200S of the semiconductor substrate 1200. In some embodiments, the profile of the gate structure G may be substantially the same with the profile of the dummy gate structure 1207 as described in FIG. 17A, FIG. 23A, FIG. 23B or FIG. 23C. In some embodiments, the profile of the work function metal 2101 of the gate structure G may be substantially the same with the profile of the dummy gate structure as described in FIG. 17A, FIG. 23A, FIG. 23B or FIG. 23C. In some embodiments, the profile of the metal gate fill material 2102 may be rectangular or square. In other embodiments, the profile of the metal gate fill material 2102 may also be substantially the same with the profile of the dummy gate structure 1207 as described in FIG. 17A, FIG. 23A, FIG. 23B or FIG. 23C.

In some embodiments, the profile of the bottom portion G1 may be related to the sidewall profile P1, P1' as described in FIG. 17A, FIG. 23A, FIG. 23B or FIG. 23C and the profile of the top portion G2 may be related to the sidewall profile P2, P2' as described in FIG. 17A, FIG. 23A, FIG. 23B or FIG. 23C. In some embodiments, the bottom portion G1 may include a trapezoidal cross-sectional shape or an inverse trapezoidal cross-sectional shape. In some embodiments, the angle θ between the sidewall L1 of the bottom portion G1 and the sidewall L2 of the top portion G2 is smaller than 180 degrees.

Figure 24A:
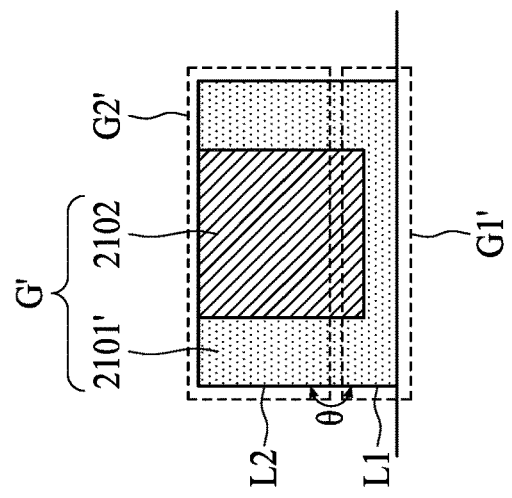
FIG. 24A, FIG. 24B and FIG. 24C illustrate the sidewall profiles of the gate structure, in accordance with some embodiments of the present disclosure.
Figure 24B:
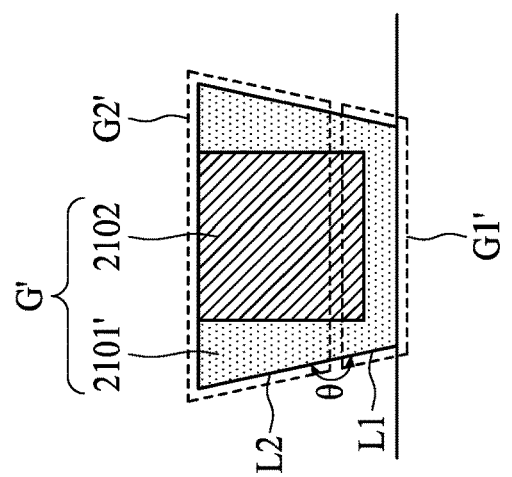
Figure 24C:
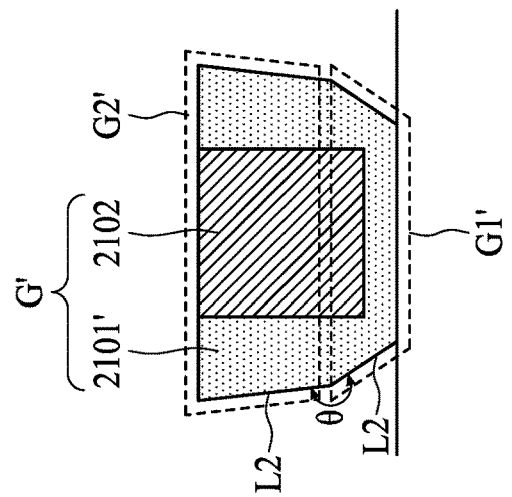

FIG. 24A, FIG. 24B, and FIG. 24C are the sidewall profiles of the gate structure G', in accordance with some embodiments of the present disclosure. In some embodiments, the profile of the gate structure G' may be substantially the same with the profile of the dummy gate structure 1207' as described in FIG. 23A, FIG. 23B, and FIG. 23C respectively. In some embodiments, the profile of the bottom portion G1' may be related to the sidewall profile P1' as described in FIG. 23A, FIG. 23B, and FIG. 23C respectively, and the profile of the top portion G2' may be related to the sidewall profile P2' as described in FIG. 23A, FIG. 23B, and FIG. 23C respectively.

Figure 22A:
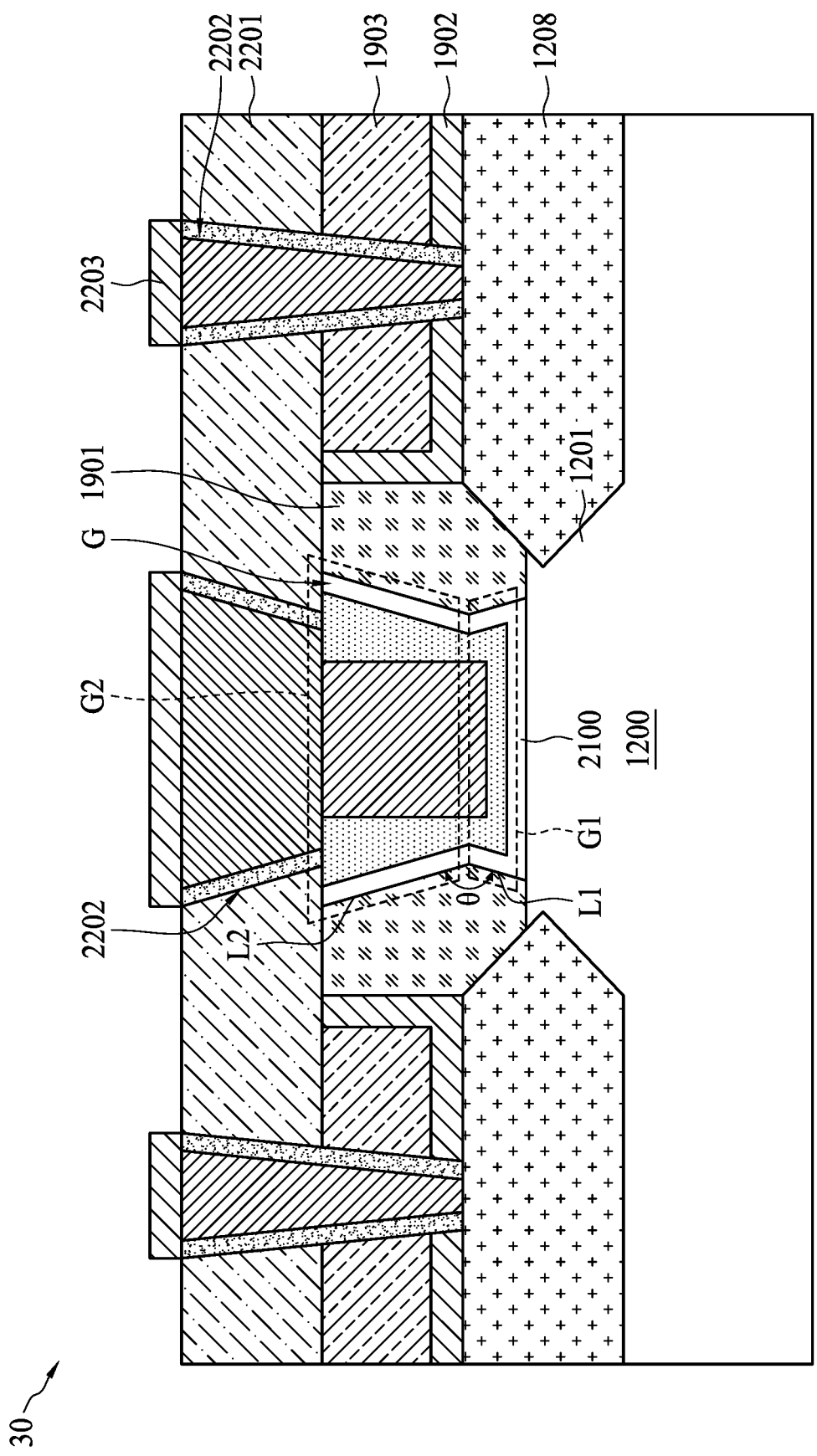
Figure 22B:
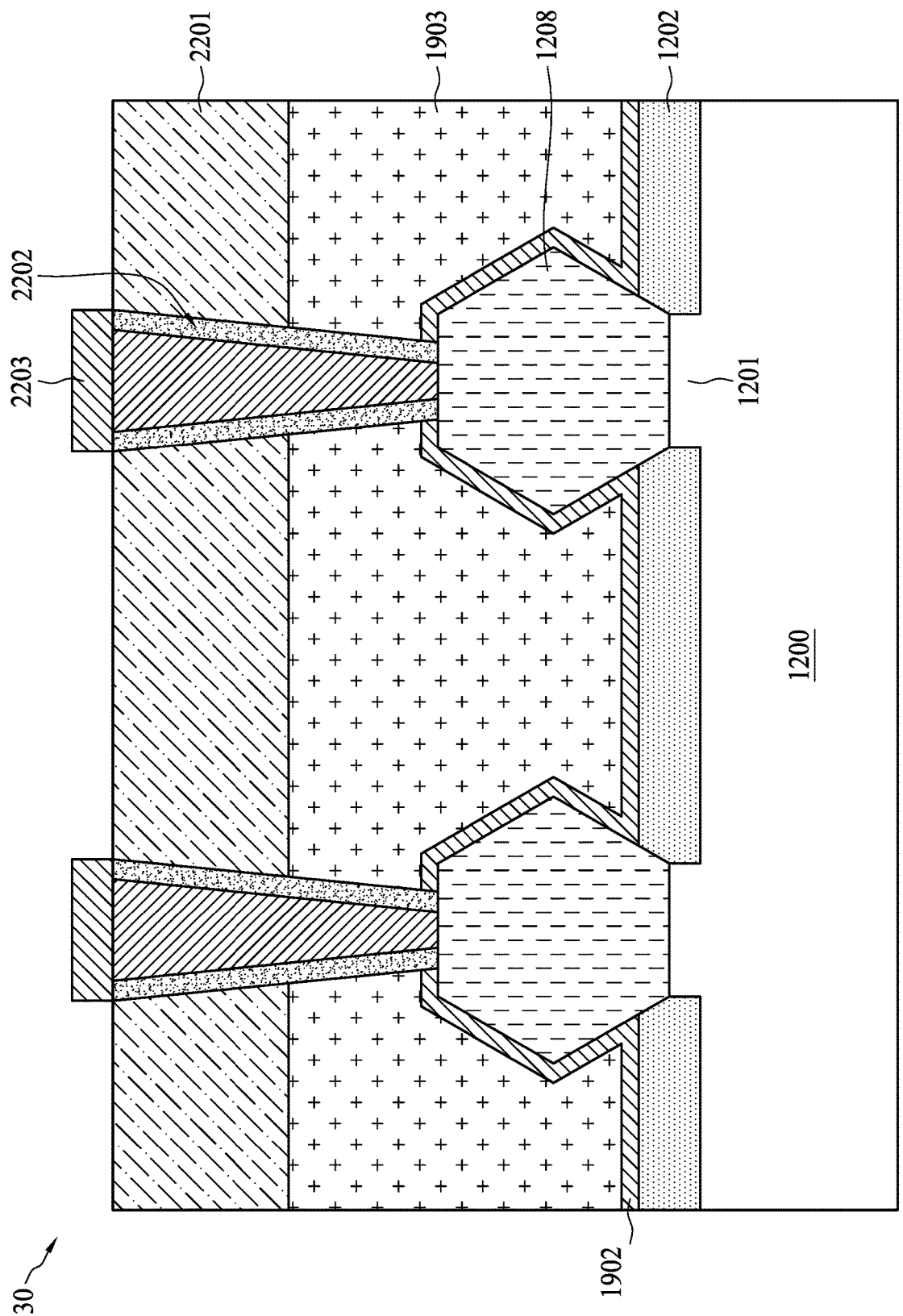

Referring to FIG. 22A and FIG. 22B, in some embodiments, a dielectric layer 2201 is formed over the gate structure G. A plurality of conductive vias 2202 are formed in the dielectric layer 1903 and 2201 to electrically connect the gate structure G with the metal lines 2203, and to electrically connect the source/drain regions 1208 with the metal lines 2203. In some embodiments, salicide (not shown) can be formed between the conductive via 2202 and the source/drain regions 1208 for reducing contact resistance. The forming of the conductive vias 2202 are similar to the operations described in FIG. 2, FIG. 3, FIG. 4, FIG. 5, FIG. 6, FIG. 7, FIG. 8, FIG. 9, FIG. 10, FIG. 11A, FIG. 11B, FIG. 11C, FIG. 12A, and FIG. 12B, and here is omitted for brevity.

Examples of devices that can benefit from one or more embodiments of the present disclosure are semiconductor devices such as, for example but not limited, a planar metal-oxide-semiconductor field effect transistor (MOSFET) or a fin FET (FinFET) device. The FinFET device, for example, may be a complementary MOS (CMOS) device including a p-type MOS FinFET device and an n-type MOS FinFET device. It is understood that the application should be not limited to a particular type of device, except as specifically claimed.

In one or more embodiments of present disclosure, a plurality of dopants may be formed in a semiconductive layer used as a mask layer or a dummy gate structure. The sidewall profile of the patterned semiconductive layer may be adjustable according to the distribution of the dopants. In one or more embodiments of present disclosure, the dummy gate structure may be formed by a non-doped top portion and a doped bottom portion. In some embodiments, the sidewall profile of the dummy gate structure may be adjustable with the doped bottom portion. In some embodiments, after removing the dummy gate structure, the aspect ratio and critical dimension of the gap profile may be improved, and thus the gap fill ability for the gate structure may be improved. In one or more embodiments of present disclosure, while the doped semiconductive layer used as a mask layer, an opening profile formed by the doped semiconductive layer may be adjustable accordingly. In some embodiments, the opening profile may be enlarged and the bridge issue of the via hole in the subsequent operations may be alleviated. The profile of the gate structure of the semiconductor device can be controlled to a desired shape, which allows to improve gap filling ability of the gate material, and allows to modulate the characteristics of the semiconductor device.

According to some embodiments of present disclosure, a method for manufacturing a semiconductor device is provided. The method includes following operations. A semiconductor substrate is received. A first semiconductive layer over the semiconductor substrate is formed. A plurality of dopants are formed in a first portion of the first semiconductive layer. A second portion of the first semiconductive layer is removed to form a patterned first semiconductive layer. A first sidewall profile of the first portion after the removing the second portion of the first semiconductive layer is controlled by adjusting a distribution of the plurality of dopants in the first portion.

According to other embodiments of present disclosure, a method for manufacturing a semiconductor device is provided. The method includes following operations. A semiconductor substrate is received. A patterned semiconductive layer over the semiconductor substrate is formed. The patterned semiconductive layer includes a first patterned semiconductive layer. The first patterned semiconductive layer is doped. A dielectric layer is formed on two opposite sides of the patterned semiconductive layer. The patterned semiconductive layer is removed to form a gate trench in the dielectric layer. A gate structure is formed in the gate trench of the dielectric layer.

According to other embodiments of present disclosure, a semiconductor device is provided. The semiconductor device includes a semiconductor substrate, a pair of source/drain regions, and a gate structure. The source/drain regions are formed on the semiconductor substrate. The gate structure is disposed on the semiconductor substrate and between the source/drain regions. The gate structure includes a gate electrode having a bottom portion and a top portion over the bottom portion. A first sidewall of the bottom portion is oblique to a top surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   receiving a semiconductor substrate;
   forming a dielectric layer over the semiconductor substrate;
   forming a first semiconductive layer over the dielectric layer;
   forming a plurality of dopants in a first portion of the first semiconductive layer over the dielectric layer;
   removing a second portion of the first semiconductive layer to form a patterned first semiconductive layer over the dielectric layer, wherein a first sidewall profile of the first portion after the removing the second portion of the first semiconductive layer is controlled by adjusting a distribution of the plurality of dopants in the first portion; and
   using the patterned first semiconductive layer as a mask to pattern the dielectric layer to form a hole in the dielectric layer, wherein a sidewall profile of the hole in the dielectric layer is controlled by the first sidewall profile of the first portion of the patterned first semiconductive layer.

2. The method of claim 1, wherein a concentration of the plurality of dopants near a bottom surface of the first portion is higher than a concentration of the plurality of dopants near a top surface of the first portion, and the first sidewall profile comprises a trapezoidal cross-sectional shape.

3. The method of claim 1, wherein a concentration of the plurality of dopants near a top surface of the first portion is higher than a concentration of the plurality of dopants near a bottom surface of the first portion, and the first sidewall profile is curved.

4. The method of claim 1, wherein the forming the plurality of dopants in the first portion comprises:
   forming a mask layer over the first semiconductive layer, wherein the mask layer exposes the first portion of the first semiconductive layer; and
   performing an ion implantation to form the plurality of dopants in the first portion exposed from the mask layer.

5. The method of claim 1, wherein the forming the plurality of dopants in the first portion comprises:
   forming a dopant source film on the first semiconductive layer;
   forming a thermal transferring pattern over the dopant source film, wherein the thermal transferring pattern is aligned with the first portion of the first semiconductive layer; and
   performing an annealing operation to drive in the plurality of dopants from the dopant source film into the first semiconductive layer.

6. The method of claim 1, wherein before the removing the second portion of the first semiconductive layer, the method further comprises:
   forming a second semiconductive layer on the first semiconductive layer; and
   patterning the second semiconductive layer to form a patterned second semiconductive layer,
   wherein a second sidewall profile of the patterned second semiconductive layer is different from the first sidewall profile.

7. The method of claim 6, wherein a combined shape of the first sidewall profile and the second sidewall profile comprises rectangular, tapered rectangular or hourglass shape.

8. The method of claim 1, further comprising:
   forming a metal layer in the hole; and
   removing the patterned first semiconductive layer.

9. The method of claim 8, wherein the semiconductor substrate comprises a doped region, and the metal layer is electrically coupled to the doped region.

10. A method of manufacturing a semiconductor device, comprising:
    receiving a semiconductor substrate;
    forming a semiconductive layer over the semiconductor substrate;
    forming a doped portion and an undoped portion in the semiconductive layer, wherein the doped portion and the undoped portion are arranged along a direction parallel with a surface of the semiconductor substrate;
    removing the undoped portion to form a patterned semiconductive layer over the semiconductor substrate, wherein the patterned semiconductive layer comprises a first patterned semiconductive layer, and the first patterned semiconductive layer is the doped portion;
    forming a dielectric layer on two opposite sides of the patterned semiconductive layer;
    removing the patterned semiconductive layer to form a gate trench in the dielectric layer; and
    forming a gate structure in the gate trench of the dielectric layer.

11. The method of claim 10, wherein a sidewall profile of the doped portion after the removing the undoped portion of the semiconductive layer is controlled by adjusting a distribution of the plurality of dopants in the first portion.

12. The method of claim 10, wherein the patterned semiconductive layer further comprises a second patterned semiconductive layer stacked to the first patterned semiconductive layer.

13. The method of claim 12, wherein the second patterned semiconductive layer is doped, and a doping profile of the second patterned semiconductive layer is different from that of the first patterned semiconductive layer.

14. The method of claim 12, wherein the second patterned semiconductive layer is undoped.

15. The method of claim 10, further comprising:
    partially removing the semiconductor substrate uncovered by the patterned semiconductive layer; and
    forming a pair of source/drain regions on the semiconductor substrate.

16. A semiconductor device, comprising:
    a semiconductor substrate;
    a pair of source/drain regions on the semiconductor substrate; and
    a gate structure on the semiconductor substrate and between the pair of source/drain regions, the gate structure comprising:
    a gate electrode comprising a bottom portion and a top portion over the bottom portion,
    wherein a first sidewall of the bottom portion is oblique to a top surface of the semiconductor substrate, the gate electrode further comprises a first metal layer and a second metal layer, the first metal layer is in contact with a sidewall of the second metal layer, a sidewall of the first metal layer and the top surface of the semiconductor substrate form a first included angle, the sidewall of the second metal layer and the top surface of the semiconductor substrate form a second included angle, and the second included angle is different from the first included angle.

17. The semiconductor device of claim 16, wherein an angle between the first sidewall and a second sidewall of the top portion is larger than 180 degrees.

18. The semiconductor device of claim 16, wherein an angle between the first sidewall and a second sidewall of the top portion is smaller than 180 degrees.

19. The semiconductor device of claim 16, further comprising a spacer structure on opposite sides of the gate structure.

20. The semiconductor device of claim 16, wherein the first metal layer comprises a work function metal layer.

* * * * *